(12) United States Patent
Hirota

(10) Patent No.: US 9,097,981 B2
(45) Date of Patent: Aug. 4, 2015

(54) ILLUMINATION OPTICAL APPARATUS, EXPOSURE APPARATUS, AND DEVICE MANUFACTURING METHOD

(75) Inventor: Hiroyuki Hirota, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 915 days.

(21) Appl. No.: 12/250,519

(22) Filed: Oct. 13, 2008

(65) Prior Publication Data
US 2009/0128886 A1    May 21, 2009

Related U.S. Application Data

(60) Provisional application No. 60/996,035, filed on Oct. 25, 2007.

(30) Foreign Application Priority Data

Oct. 12, 2007    (JP) ................. 2007-266691

(51) Int. Cl.
G03B 27/54 (2006.01)
G03B 27/72 (2006.01)
G03F 7/20 (2006.01)
(52) U.S. Cl.
CPC ........ *G03F 7/70116* (2013.01); *G03F 7/70291* (2013.01)
(58) Field of Classification Search
CPC ... G03F 7/70; G03F 7/70075; G03F 7/70291; G03F 7/70116
USPC ............. 355/53, 67–68, 71, 75, 77; 359/385, 359/871–872, 850–851; 250/492.2
See application file for complete search history.

(56) References Cited

U.S. PATENT DOCUMENTS

| 4,346,164 | A | | 8/1982 | Tabarelli et al. |
| 5,153,428 | A | * | 10/1992 | Ellis .................. 250/234 |
| 5,216,541 | A | | 6/1993 | Takesue et al. |
| 5,251,222 | A | | 10/1993 | Hester et al. |
| 5,312,513 | A | | 5/1994 | Florence et al. |
| 5,383,000 | A | | 1/1995 | Michaloski et al. |
| 5,461,410 | A | * | 10/1995 | Venkateswar et al. ........ 347/240 |
| 5,850,300 | A | | 12/1998 | Kathman et al. |

(Continued)

FOREIGN PATENT DOCUMENTS

| CN | 1501175 A | 6/2004 |
| CN | 1573571 A | 2/2005 |

(Continued)

OTHER PUBLICATIONS

Office Action dated Jul. 12, 2011 in Chinese Patent Application No. 200880018312.8.

(Continued)

*Primary Examiner* — Colin Kreutzer
(74) *Attorney, Agent, or Firm* — Oliff PLC

(57) ABSTRACT

An illumination optical apparatus guides exposure light emitted from an exposure light source, to an illumination target object. The illumination optical apparatus has a plurality of spatial light modulation members arranged in an array form, and each spatial light modulation member is so configured that a plurality of reflecting optical elements each including a movable reflecting surface are arranged in an array form. At least one of the spatial light modulation members is arranged in an optical path of the light emitted from the light source.

15 Claims, 10 Drawing Sheets

(56) References Cited

U.S. PATENT DOCUMENTS

| | | |
|---|---|---|
| 5,850,310 A | 12/1998 | Schweizer |
| 5,991,009 A | 11/1999 | Nishi et al. |
| 6,406,148 B1 | 6/2002 | Marshall et al. |
| 6,466,304 B1 | 10/2002 | Smith |
| 6,577,379 B1 | 6/2003 | Boettiger et al. |
| 6,577,429 B1 | 6/2003 | Kurtz et al. |
| 6,665,119 B1 | 12/2003 | Kurtz et al. |
| 6,737,662 B2 | 5/2004 | Mulder et al. |
| 6,819,490 B2 | 11/2004 | Sandstrom et al. |
| 6,829,090 B2 | 12/2004 | Katsumata et al. |
| 6,844,927 B2 | 1/2005 | Stokowski et al. |
| 6,885,493 B2 | 4/2005 | Ljungblad et al. |
| 6,891,655 B2 | 5/2005 | Grebinski et al. |
| 6,900,915 B2 | 5/2005 | Nanjyo et al. |
| 6,958,806 B2 | 10/2005 | Mulder et al. |
| 6,958,867 B2 | 10/2005 | Ohmori et al. |
| 6,960,035 B2 | 11/2005 | Okazaki et al. |
| 6,961,116 B2 | 11/2005 | Den Boef et al. |
| 6,977,718 B1 | 12/2005 | LaFontaine |
| 7,015,491 B2 | 3/2006 | Eurlings et al. |
| 7,030,962 B2 | 4/2006 | Iizuka et al. |
| 7,061,226 B2 | 6/2006 | Dürr |
| 7,095,481 B2 | 8/2006 | Morohoshi |
| 7,095,546 B2 | 8/2006 | Mala et al. |
| 7,095,921 B2 | 8/2006 | Okazaki et al. |
| 7,116,403 B2 | 10/2006 | Troost et al. |
| 7,121,740 B2 | 10/2006 | Okazaki et al. |
| 7,130,021 B2 | 10/2006 | Kobayashi |
| 7,130,120 B2 | 10/2006 | Katsumata et al. |
| 7,148,952 B2 | 12/2006 | Eurlings et al. |
| 7,177,012 B2 | 2/2007 | Bleeker et al. |
| 7,193,684 B2 | 3/2007 | Iizuka et al. |
| 7,259,827 B2 | 8/2007 | Dierichs |
| 7,289,276 B2 | 10/2007 | Ohmori et al. |
| 7,400,382 B2 | 7/2008 | Baba-Ali et al. |
| 7,423,731 B2 | 9/2008 | Tanitsu et al. |
| 7,508,492 B2 | 3/2009 | Sekigawa et al. |
| 7,525,642 B2 | 4/2009 | Mulder et al. |
| 7,532,378 B2 | 5/2009 | Tanaka et al. |
| 7,542,129 B2 | 6/2009 | Sandstrom |
| 7,551,261 B2 | 6/2009 | Fiolka |
| 7,573,052 B2 | 8/2009 | Inoue et al. |
| 7,573,564 B2 | 8/2009 | Ruff et al. |
| 7,580,559 B2 | 8/2009 | Latypov et al. |
| 7,605,386 B2 | 10/2009 | Singer et al. |
| 7,701,555 B2 | 4/2010 | Arai |
| 7,714,983 B2 | 5/2010 | Koehler et al. |
| 7,965,380 B2 | 6/2011 | Bleeker et al. |
| 8,018,589 B2 | 9/2011 | MacKinnon et al. |
| 2003/0071204 A1 | 4/2003 | Sandstrom et al. |
| 2003/0098959 A1 | 5/2003 | Hagiwara et al. |
| 2003/0214571 A1 | 11/2003 | Ishikawa et al. |
| 2004/0053148 A1 | 3/2004 | Morohoshi |
| 2004/0057034 A1 | 3/2004 | Zinn et al. |
| 2004/0100629 A1 | 5/2004 | Stokowski et al. |
| 2004/0108467 A1 | 6/2004 | Eurlings et al. |
| 2004/0130775 A1 | 7/2004 | Grebinski |
| 2004/0160582 A1 | 8/2004 | Lof et al. |
| 2004/0207386 A1 | 10/2004 | Durr |
| 2005/0024612 A1 | 2/2005 | Hirukawa et al. |
| 2005/0041232 A1 | 2/2005 | Yamada et al. |
| 2005/0094122 A1 | 5/2005 | Hagiwara et al. |
| 2005/0095749 A1 | 5/2005 | Krellmann et al. |
| 2005/0141583 A1 | 6/2005 | Sandstrom |
| 2005/0168790 A1 | 8/2005 | Latypov et al. |
| 2005/0213068 A1* | 9/2005 | Ishii et al. .................. 355/67 |
| 2005/0231703 A1 | 10/2005 | Kobayashi |
| 2005/0270515 A1* | 12/2005 | Troost et al. ................ 355/69 |
| 2005/0281516 A1 | 12/2005 | Okazaki et al. |
| 2006/0001855 A1 | 1/2006 | Lof et al. |
| 2006/0050261 A1 | 3/2006 | Brotsack |
| 2006/0055834 A1 | 3/2006 | Tanitsu et al. |
| 2006/0114446 A1* | 6/2006 | Gui ............................ 355/77 |
| 2006/0138349 A1 | 6/2006 | Bleeker et al. |
| 2006/0170901 A1 | 8/2006 | Tanitsu et al. |
| 2006/0175556 A1 | 8/2006 | Yabuki |
| 2006/0176452 A1 | 8/2006 | Kim et al. |
| 2006/0203214 A1 | 9/2006 | Shiraishi |
| 2006/0232841 A1 | 10/2006 | Toishi et al. |
| 2006/0245033 A1 | 11/2006 | Baba-Ali et al. |
| 2007/0013888 A1 | 1/2007 | Flagello et al. |
| 2007/0146676 A1 | 6/2007 | Tanitsu et al. |
| 2007/0165202 A1 | 7/2007 | Koehler et al. |
| 2007/0201338 A1 | 8/2007 | Yaoita et al. |
| 2007/0273852 A1 | 11/2007 | Arai |
| 2007/0273853 A1 | 11/2007 | Bleeker et al. |
| 2008/0021948 A1 | 1/2008 | Wilson et al. |
| 2008/0030707 A1 | 2/2008 | Tanaka et al. |
| 2008/0079930 A1 | 4/2008 | Klarenbeek |
| 2008/0095531 A1 | 4/2008 | Yeo et al. |
| 2008/0239268 A1 | 10/2008 | Mulder et al. |
| 2008/0259304 A1 | 10/2008 | Dierichs |
| 2009/0021656 A1 | 1/2009 | Ozaki |
| 2009/0033902 A1 | 2/2009 | Mulder et al. |
| 2009/0073411 A1 | 3/2009 | Tanitsu |
| 2009/0091730 A1 | 4/2009 | Tanaka |
| 2009/0097007 A1 | 4/2009 | Tanaka |
| 2009/0097094 A1 | 4/2009 | Tanaka |
| 2009/0109417 A1 | 4/2009 | Tanitsu |
| 2009/0128886 A1 | 5/2009 | Hirota |
| 2009/0147247 A1 | 6/2009 | Endo et al. |
| 2009/0174877 A1 | 7/2009 | Mulder et al. |
| 2009/0263736 A1 | 10/2009 | Inoue et al. |
| 2010/0195077 A1 | 8/2010 | Koehler et al. |
| 2012/0202157 A1 | 8/2012 | Tanitsu |
| 2012/0236284 A1 | 9/2012 | Tanaka |

FOREIGN PATENT DOCUMENTS

| | | |
|---|---|---|
| CN | 1576908 A | 2/2005 |
| CN | 1601322 A | 3/2005 |
| CN | 1879062 A | 12/2006 |
| DE | 206 607 | 2/1984 |
| DE | 221 563 A1 | 4/1985 |
| DE | 224 448 A1 | 7/1985 |
| DE | 242 880 A1 | 2/1987 |
| DE | 196 35 792 A1 | 4/1997 |
| DE | 100 29 938 A1 | 7/2001 |
| DE | 10343333 A1 | 4/2005 |
| EP | 0 023 231 A1 | 2/1981 |
| EP | 0 208 552 A2 | 1/1987 |
| EP | 0 656 555 A1 | 6/1995 |
| EP | 0 764 858 A2 | 3/1997 |
| EP | 0 779 530 | 6/1997 |
| EP | 1 109 067 A2 | 6/2001 |
| EP | 1 211 561 A2 | 6/2002 |
| EP | 1 262 836 A1 | 12/2002 |
| EP | 1 280 007 A2 | 1/2003 |
| EP | 1 395 049 A1 | 3/2004 |
| EP | 1 489 462 A2 | 12/2004 |
| EP | 1674935 A2 | 6/2006 |
| EP | 1 798 758 A1 | 6/2007 |
| EP | 1 882 895 A1 | 1/2008 |
| EP | 1 993 120 A1 | 11/2008 |
| FR | 2 474 708 | 7/1981 |
| JP | A-44-4993 | 2/1969 |
| JP | A-52666 | 1/1981 |
| JP | A-57-117238 | 7/1982 |
| JP | A-57-152129 | 9/1982 |
| JP | A-57-153433 | 9/1982 |
| JP | A-58-49932 | 3/1983 |
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |
| JP | A-61-44429 | 3/1986 |
| JP | A-61-45923 | 3/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |

(56) References Cited

FOREIGN PATENT DOCUMENTS

| | | |
|---|---|---|
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |
| JP | A-1-255404 | 10/1989 |
| JP | A-1-258550 | 10/1989 |
| JP | A-1-276043 | 11/1989 |
| JP | A-1-278240 | 11/1989 |
| JP | A-1-286478 | 11/1989 |
| JP | A-1-292343 | 11/1989 |
| JP | A-1-314247 | 12/1989 |
| JP | A-1-319964 | 12/1989 |
| JP | A-2-42382 | 2/1990 |
| JP | A-2-65149 | 3/1990 |
| JP | A-2-65222 | 3/1990 |
| JP | A-2-97239 | 4/1990 |
| JP | A-2-106917 | 4/1990 |
| JP | A-2-116115 | 4/1990 |
| JP | A-2-139146 | 5/1990 |
| JP | A-2-166717 | 6/1990 |
| JP | A-2-261073 | 10/1990 |
| JP | A-2-264901 | 10/1990 |
| JP | A-2-285320 | 11/1990 |
| JP | A-2-287308 | 11/1990 |
| JP | A-2-298431 | 12/1990 |
| JP | A-2-311237 | 12/1990 |
| JP | A-3-41399 | 2/1991 |
| JP | A-3-64811 | 3/1991 |
| JP | A-3-72298 | 3/1991 |
| JP | A-3-94445 | 4/1991 |
| JP | A-3-132663 | 6/1991 |
| JP | A-3-134341 | 6/1991 |
| JP | A-3-167419 | 7/1991 |
| JP | A-3-168640 | 7/1991 |
| JP | A-3-211812 | 9/1991 |
| JP | A-3-263810 | 11/1991 |
| JP | A-4-11613 | 1/1992 |
| JP | A-4-32154 | 2/1992 |
| JP | A-4-065603 | 3/1992 |
| JP | A-4-96315 | 3/1992 |
| JP | A-4-101148 | 4/1992 |
| JP | A-4-130710 | 5/1992 |
| JP | A-4-132909 | 5/1992 |
| JP | A-4-133414 | 5/1992 |
| JP | A-4-152512 | 5/1992 |
| JP | A-4-179115 | 6/1992 |
| JP | A-4-186244 | 7/1992 |
| JP | U-4-80052 | 7/1992 |
| JP | A-4-211110 | 8/1992 |
| JP | A-4-225357 | 8/1992 |
| JP | A-4-235558 | 8/1992 |
| JP | A-4-265805 | 9/1992 |
| JP | A-4-273245 | 9/1992 |
| JP | A-4-273427 | 9/1992 |
| JP | A-4-280619 | 10/1992 |
| JP | A-4-282539 | 10/1992 |
| JP | A-4-296092 | 10/1992 |
| JP | A-4-297030 | 10/1992 |
| JP | A-4-305915 | 10/1992 |
| JP | A-4-305917 | 10/1992 |
| JP | U-4-117212 | 10/1992 |
| JP | A-4-330961 | 11/1992 |
| JP | A-4-343307 | 11/1992 |
| JP | A-4-350925 | 12/1992 |
| JP | A-5-13292 | 1/1993 |
| JP | A-5-21314 | 1/1993 |
| JP | A-5-45886 | 2/1993 |
| JP | A-5-62877 | 3/1993 |
| JP | A-5-90128 | 4/1993 |
| JP | A-5-109601 | 4/1993 |
| JP | A-5-127086 | 5/1993 |
| JP | A-5-129184 | 5/1993 |
| JP | A-5-134230 | 5/1993 |
| JP | A-5-160002 | 6/1993 |
| JP | A-5-175098 | 7/1993 |
| JP | A-5-199680 | 8/1993 |
| JP | A-5-217837 | 8/1993 |
| JP | A-5-217840 | 8/1993 |
| JP | A-5-241324 | 9/1993 |
| JP | A-5-243364 | 9/1993 |
| JP | A-5-259069 | 10/1993 |
| JP | A-5-283317 | 10/1993 |
| JP | A-5-304072 | 11/1993 |
| JP | A-5-319774 | 12/1993 |
| JP | A-5-323583 | 12/1993 |
| JP | A-5-326370 | 12/1993 |
| JP | A-6-29204 | 2/1994 |
| JP | A-6-42918 | 2/1994 |
| JP | A-6-53120 | 2/1994 |
| JP | A-6-97269 | 4/1994 |
| JP | A-6-104167 | 4/1994 |
| JP | A-6-120110 | 4/1994 |
| JP | B2-6-29102 | 4/1994 |
| JP | 6-124873 | 5/1994 |
| JP | A-6-36054 | 5/1994 |
| JP | A-6-124126 | 5/1994 |
| JP | A-6-124872 | 5/1994 |
| JP | A-6-124873 | 5/1994 |
| JP | A-6-140306 | 5/1994 |
| JP | A-6-148399 | 5/1994 |
| JP | A-6-163350 | 6/1994 |
| JP | A-6-168866 | 6/1994 |
| JP | A-6-177007 | 6/1994 |
| JP | A-6-181157 | 6/1994 |
| JP | A-6-186025 | 7/1994 |
| JP | A-6-188169 | 7/1994 |
| JP | A-6-196388 | 7/1994 |
| JP | A-6-204113 | 7/1994 |
| JP | A-6-204121 | 7/1994 |
| JP | A-6-229741 | 8/1994 |
| JP | A-6-241720 | 9/1994 |
| JP | A-6-244082 | 9/1994 |
| JP | A-6-267825 | 9/1994 |
| JP | 6-291023 | 10/1994 |
| JP | A-6-283403 | 10/1994 |
| JP | A-06-291023 | 10/1994 |
| JP | A-6-310399 | 11/1994 |
| JP | A-6-325894 | 11/1994 |
| JP | A-6-326174 | 11/1994 |
| JP | A-6-349701 | 12/1994 |
| JP | A-7-69621 | 3/1995 |
| JP | A-7-92424 | 4/1995 |
| JP | A-7-122469 | 5/1995 |
| JP | A-7-132262 | 5/1995 |

(56) References Cited

FOREIGN PATENT DOCUMENTS

| | | |
|---|---|---|
| JP | A-7-134955 | 5/1995 |
| JP | A-7-135158 | 5/1995 |
| JP | A-7-135165 | 5/1995 |
| JP | A-7-147223 | 6/1995 |
| JP | A-7-167998 | 7/1995 |
| JP | A-7-168286 | 7/1995 |
| JP | A-7-174974 | 7/1995 |
| JP | A-7-176468 | 7/1995 |
| JP | A-7-183201 | 7/1995 |
| JP | A-7-183214 | 7/1995 |
| JP | A-7-190741 | 7/1995 |
| JP | A-7-201723 | 8/1995 |
| JP | A-7-220989 | 8/1995 |
| JP | A-7-220990 | 8/1995 |
| JP | A-7-220995 | 8/1995 |
| JP | A-7-221010 | 8/1995 |
| JP | A-7-239212 | 9/1995 |
| JP | A-7-243814 | 9/1995 |
| JP | A-7-245258 | 9/1995 |
| JP | A-7-263315 | 10/1995 |
| JP | A-7-283119 | 10/1995 |
| JP | A-7-297272 | 11/1995 |
| JP | A-7-307268 | 11/1995 |
| JP | A-7-318847 | 12/1995 |
| JP | A-7-335748 | 12/1995 |
| JP | A-8-10971 | 1/1996 |
| JP | A-8-17709 | 1/1996 |
| JP | A-8-22948 | 1/1996 |
| JP | A-8-37149 | 2/1996 |
| JP | A-8-37227 | 2/1996 |
| JP | A-8-46751 | 2/1996 |
| JP | A-8-63231 | 3/1996 |
| JP | A-8-115868 | 5/1996 |
| JP | A-8-136475 | 5/1996 |
| JP | A-8-151220 | 6/1996 |
| JP | A-8-162397 | 6/1996 |
| JP | A-8-166475 | 6/1996 |
| JP | A-8-171054 | 7/1996 |
| JP | A-8-195375 | 7/1996 |
| JP | A-8-203803 | 8/1996 |
| JP | A-8-279549 | 10/1996 |
| JP | 8-313842 | 11/1996 |
| JP | A-8-288213 | 11/1996 |
| JP | A-8-297699 | 11/1996 |
| JP | A-8-316125 | 11/1996 |
| JP | A-8-316133 | 11/1996 |
| JP | A-8-330224 | 12/1996 |
| JP | A-8-334695 | 12/1996 |
| JP | A-8-335552 | 12/1996 |
| JP | A-9-7933 | 1/1997 |
| JP | A-9-15834 | 1/1997 |
| JP | A-9-22121 | 1/1997 |
| JP | A-9-61686 | 3/1997 |
| JP | A-9-82626 | 3/1997 |
| JP | A-9-83877 | 3/1997 |
| JP | A-9-92593 | 4/1997 |
| JP | A-9-108551 | 4/1997 |
| JP | A-9-115794 | 5/1997 |
| JP | A-9-134870 | 5/1997 |
| JP | A-9-148406 | 6/1997 |
| JP | A-9-151658 | 6/1997 |
| JP | A-9-160004 | 6/1997 |
| JP | A-9-160219 | 6/1997 |
| JP | A-9-162106 | 6/1997 |
| JP | A-9-178415 | 7/1997 |
| JP | A-9-184787 | 7/1997 |
| JP | A-9-184918 | 7/1997 |
| JP | A-9-186082 | 7/1997 |
| JP | A-9-190969 | 7/1997 |
| JP | A-9-213129 | 8/1997 |
| JP | A-9-219358 | 8/1997 |
| JP | A-9-215208 | 9/1997 |
| JP | A-9-227294 | 9/1997 |
| JP | A-9-232213 | 9/1997 |
| JP | A-9-243892 | 9/1997 |
| JP | A-9-246672 | 9/1997 |
| JP | A-9-281077 | 10/1997 |
| JP | A-9-325255 | 12/1997 |
| JP | A-9-326338 | 12/1997 |
| JP | A-10-002865 | 1/1998 |
| JP | A-10-3039 | 1/1998 |
| JP | A-10-20195 | 1/1998 |
| JP | A-10-32160 | 2/1998 |
| JP | A-10-38517 | 2/1998 |
| JP | A-10-38812 | 2/1998 |
| JP | A-10-55713 | 2/1998 |
| JP | A-10-62305 | 3/1998 |
| JP | A-10-64790 | 3/1998 |
| JP | A-10-79337 | 3/1998 |
| JP | A-10-82611 | 3/1998 |
| JP | A-10-92735 | 4/1998 |
| JP | A-10-97969 | 4/1998 |
| JP | A-10-104427 | 4/1998 |
| JP | A-10-116760 | 5/1998 |
| JP | A-10-116778 | 5/1998 |
| JP | A-10-135099 | 5/1998 |
| JP | A-H10-116779 | 5/1998 |
| JP | A-H10-125572 | 5/1998 |
| JP | A-H10-134028 | 5/1998 |
| JP | A-10-163099 | 6/1998 |
| JP | A-10-163302 | 6/1998 |
| JP | A-10-169249 | 6/1998 |
| JP | A-10-189427 | 7/1998 |
| JP | A-10-189700 | 7/1998 |
| JP | A-10-206714 | 8/1998 |
| JP | A-10-208993 | 8/1998 |
| JP | A-10-209018 | 8/1998 |
| JP | A-10-214783 | 8/1998 |
| JP | A-10-228661 | 8/1998 |
| JP | A-10-255319 | 9/1998 |
| JP | 10-303114 | 11/1998 |
| JP | A-10-294268 | 11/1998 |
| JP | A-10-303114 | 11/1998 |
| JP | A-10-340846 | 12/1998 |
| JP | 11-003849 | 1/1999 |
| JP | A-11-3849 | 1/1999 |
| JP | A-11-3856 | 1/1999 |
| JP | A-11-8194 | 1/1999 |
| JP | A-11-14876 | 1/1999 |
| JP | A-11-16816 | 1/1999 |
| JP | A-11-40657 | 2/1999 |
| JP | A-11-54426 | 2/1999 |
| JP | A-11-74185 | 3/1999 |
| JP | A-11-87237 | 3/1999 |
| JP | A-11-111601 | 4/1999 |
| JP | A-11-111818 | 4/1999 |
| JP | A-11-111819 | 4/1999 |
| JP | A-11-121328 | 4/1999 |
| JP | A-11-135400 | 5/1999 |
| JP | A-11-142556 | 5/1999 |
| JP | A-11-150062 | 6/1999 |
| JP | A-11-159571 | 6/1999 |
| JP | A-11-162831 | 6/1999 |
| JP | A-11-163103 | 6/1999 |
| JP | A-11-164543 | 6/1999 |
| JP | A-11-166990 | 6/1999 |
| JP | A-11-98 | 7/1999 |
| JP | A-11-176727 | 7/1999 |
| JP | A-11-176744 | 7/1999 |
| JP | A-11-195602 | 7/1999 |
| JP | A-11-204390 | 7/1999 |
| JP | A-11-218466 | 8/1999 |
| JP | A-11-219882 | 8/1999 |
| JP | A-11-233434 | 8/1999 |
| JP | A-11-238680 | 8/1999 |
| JP | A-11-239758 | 9/1999 |
| JP | A-11-260686 | 9/1999 |
| JP | A-11-260791 | 9/1999 |
| JP | A-11-264756 | 9/1999 |
| JP | A-11-283903 | 10/1999 |
| JP | A-11-288879 | 10/1999 |
| JP | A-11-307610 | 11/1999 |
| JP | A-11-312631 | 11/1999 |
| JP | A-11-354624 | 12/1999 |

(56) References Cited

FOREIGN PATENT DOCUMENTS

| | | |
|---|---|---|
| JP | A-2000-3874 | 1/2000 |
| JP | A-2000-12453 | 1/2000 |
| JP | A-2000-21742 | 1/2000 |
| JP | A-2000-21748 | 1/2000 |
| JP | A-2000-29202 | 1/2000 |
| JP | A-2000-32403 | 1/2000 |
| JP | A-2000-36449 | 2/2000 |
| JP | A-2000-58436 | 2/2000 |
| JP | A-2000-81320 | 3/2000 |
| JP | A-2000-92815 | 3/2000 |
| JP | A-2000-97616 | 4/2000 |
| JP | A-2000-106340 | 4/2000 |
| JP | A-2000-114157 | 4/2000 |
| JP | A-2000-121491 | 4/2000 |
| JP | A-2000-121498 | 4/2000 |
| JP | A-2000-147346 | 5/2000 |
| JP | A-2000-154251 | 6/2000 |
| JP | A-2000-180371 | 6/2000 |
| JP | A-2000-206279 | 7/2000 |
| JP | A-2000-208407 | 7/2000 |
| JP | A-2000-240717 | 9/2000 |
| JP | A-2000-243684 | 9/2000 |
| JP | A-2000-252201 | 9/2000 |
| JP | A-2000-283889 | 10/2000 |
| JP | A-2000-286176 | 10/2000 |
| JP | A-2000-311853 | 11/2000 |
| JP | A-2000-323403 | 11/2000 |
| JP | A-2001-7015 | 1/2001 |
| JP | A-2001-20951 | 1/2001 |
| JP | A-2001-23996 | 1/2001 |
| JP | A-2001-37201 | 2/2001 |
| JP | A-2001-44097 | 2/2001 |
| JP | A-2001-74240 | 3/2001 |
| JP | A-2001-83472 | 3/2001 |
| JP | A-2001-85307 | 3/2001 |
| JP | A-2001-97734 | 4/2001 |
| JP | A-2001-110707 | 4/2001 |
| JP | A-2001-118773 | 4/2001 |
| JP | A-2001-135560 | 5/2001 |
| JP | A-2001-144004 | 5/2001 |
| JP | A-2001-167996 | 6/2001 |
| JP | A-2001-176766 | 6/2001 |
| JP | A-2001-203140 | 7/2001 |
| JP | A-2001-218497 | 8/2001 |
| JP | A-2001-228401 | 8/2001 |
| JP | A-2001-228404 | 8/2001 |
| JP | A-2001-230323 | 8/2001 |
| JP | A-2001-242269 | 9/2001 |
| JP | A-2001-265581 | 9/2001 |
| JP | A-2001-267227 | 9/2001 |
| JP | A-2001-272764 | 10/2001 |
| JP | A-2001-274083 | 10/2001 |
| JP | A-2001-282526 | 10/2001 |
| JP | A-2001-296105 | 10/2001 |
| JP | A-2001-297976 | 10/2001 |
| JP | A-2001-304332 | 10/2001 |
| JP | A-2001-307982 | 11/2001 |
| JP | A-2001-307983 | 11/2001 |
| JP | A-2001-313250 | 11/2001 |
| JP | A-2001-338868 | 12/2001 |
| JP | A-2001-345262 | 12/2001 |
| JP | A-2002-14005 | 1/2002 |
| JP | A-2002-15978 | 1/2002 |
| JP | A-2002-16124 | 1/2002 |
| JP | A-2002-43213 | 2/2002 |
| JP | A-2002-57097 | 2/2002 |
| JP | A-2002-66428 | 3/2002 |
| JP | A-2002-71513 | 3/2002 |
| JP | A-2002-75816 | 3/2002 |
| JP | A-2002-91922 | 3/2002 |
| JP | A-2002-93686 | 3/2002 |
| JP | A-2002-93690 | 3/2002 |
| JP | A-2002-100561 | 4/2002 |
| JP | A-2002-118058 | 4/2002 |
| JP | A-2002-141270 | 5/2002 |
| JP | A-2002-158157 | 5/2002 |
| JP | A-2002-170495 | 6/2002 |
| JP | A-2002-190438 | 7/2002 |
| JP | A-2002-195912 | 7/2002 |
| JP | A-2002-198284 | 7/2002 |
| JP | A-2002-202221 | 7/2002 |
| JP | A-2002-203763 | 7/2002 |
| JP | A-2002-208562 | 7/2002 |
| JP | A-2002-520810 | 7/2002 |
| JP | A-2002-222754 | 8/2002 |
| JP | A-2002-227924 | 8/2002 |
| JP | A-2002-231619 | 8/2002 |
| JP | A-2002-258487 | 9/2002 |
| JP | A-2002-261004 | 9/2002 |
| JP | A-2002-263553 | 9/2002 |
| JP | A-2002-277742 | 9/2002 |
| JP | A-2002-289505 | 10/2002 |
| JP | A-2002-305140 | 10/2002 |
| JP | A-2002-323658 | 11/2002 |
| JP | A-2002-324743 | 11/2002 |
| JP | A-2002-329651 | 11/2002 |
| JP | A-2002-334836 | 11/2002 |
| JP | 2002-353105 | 12/2002 |
| JP | A-2002-353105 | 12/2002 |
| JP | A-2002-357715 | 12/2002 |
| JP | A-2002-359174 | 12/2002 |
| JP | A-2002-362737 | 12/2002 |
| JP | A-2002-365783 | 12/2002 |
| JP | A-2002-367523 | 12/2002 |
| JP | A-2002-367886 | 12/2002 |
| JP | A-2002-373849 | 12/2002 |
| JP | A-2003-15040 | 1/2003 |
| JP | A-2003-17003 | 1/2003 |
| JP | A-2003-17404 | 1/2003 |
| JP | A-2003-28673 | 1/2003 |
| JP | A-2003-35822 | 2/2003 |
| JP | A-2003-43223 | 2/2003 |
| JP | A-2003-45219 | 2/2003 |
| JP | A-2003-45712 | 2/2003 |
| JP | A-2003-59286 | 2/2003 |
| JP | A-2003-59803 | 2/2003 |
| JP | A-2003-59821 | 2/2003 |
| JP | A-2003-68600 | 3/2003 |
| JP | A-2003-75703 | 3/2003 |
| JP | A-2003-81654 | 3/2003 |
| JP | A-2003-84445 | 3/2003 |
| JP | A-2003-98651 | 4/2003 |
| JP | A-2003-100597 | 4/2003 |
| JP | A-2003-114387 | 4/2003 |
| JP | A-2003-124095 | 4/2003 |
| JP | A-2003-130132 | 5/2003 |
| JP | A-2003-149363 | 5/2003 |
| JP | A-2003-151880 | 5/2003 |
| JP | A-2003-161882 | 6/2003 |
| JP | A-2003-163158 | 6/2003 |
| JP | A-2003-166856 | 6/2003 |
| JP | A2003-173957 | 6/2003 |
| JP | A-2003-188087 | 7/2003 |
| JP | A-2003-195223 | 7/2003 |
| JP | A-2003-224961 | 8/2003 |
| JP | A-2003-229347 | 8/2003 |
| JP | A-2003-233001 | 8/2003 |
| JP | A-2003-238577 | 8/2003 |
| JP | A-2003-240906 | 8/2003 |
| JP | A-2003-249443 | 9/2003 |
| JP | A-2003-258071 | 9/2003 |
| JP | A-2003-262501 | 9/2003 |
| JP | A-2003-263119 | 9/2003 |
| JP | A-2003-272837 | 9/2003 |
| JP | A-2003-273338 | 9/2003 |
| JP | A-2003-279889 | 10/2003 |
| JP | A-2003-282423 | 10/2003 |
| JP | A-2003-297727 | 10/2003 |
| JP | A-2003-532281 | 10/2003 |
| JP | A-2003-532282 | 10/2003 |
| JP | A-2003-311923 | 11/2003 |
| JP | A-2004-006440 | 1/2004 |
| JP | A-2004-7417 | 1/2004 |
| JP | A-2004-14642 | 1/2004 |

(56) References Cited

FOREIGN PATENT DOCUMENTS

| | | |
|---|---|---|
| JP | A-2004-14876 | 1/2004 |
| JP | A-2004-15187 | 1/2004 |
| JP | A-2004-22708 | 1/2004 |
| JP | A-2004-38247 | 2/2004 |
| JP | A-2004-39952 | 2/2004 |
| JP | A-2004-40039 | 2/2004 |
| JP | A-2004-45063 | 2/2004 |
| JP | A-2004-63847 | 2/2004 |
| JP | A-2004-71851 | 3/2004 |
| JP | A-2004-85612 | 3/2004 |
| JP | A-2004-87987 | 3/2004 |
| JP | A-2004-093624 | 3/2004 |
| JP | A-2004-95653 | 3/2004 |
| JP | U-3102327 | 3/2004 |
| JP | A-2004-98012 | 4/2004 |
| JP | A-2004-101362 | 4/2004 |
| JP | A-2004-103674 | 4/2004 |
| JP | A-2004-111569 | 4/2004 |
| JP | A-2004-111579 | 4/2004 |
| JP | A-2004-119497 | 4/2004 |
| JP | A-2004-119717 | 4/2004 |
| JP | A-2004-128307 | 4/2004 |
| JP | A-2004-134682 | 4/2004 |
| JP | A-2004-140145 | 5/2004 |
| JP | A-2004-145269 | 5/2004 |
| JP | A-2004-146702 | 5/2004 |
| JP | A-2004-152705 | 5/2004 |
| JP | A-2004-153064 | 5/2004 |
| JP | A-2004-153096 | 5/2004 |
| JP | A-2004-163555 | 6/2004 |
| JP | A-2004-165249 | 6/2004 |
| JP | A-2004-165416 | 6/2004 |
| JP | A-2004-172471 | 6/2004 |
| JP | A-2004-177468 | 6/2004 |
| JP | A-2004-179172 | 6/2004 |
| JP | A-2004-187401 | 7/2004 |
| JP | A-2004-193252 | 7/2004 |
| JP | A-2004-193425 | 7/2004 |
| JP | A-2004-198748 | 7/2004 |
| JP | A-2004-205698 | 7/2004 |
| JP | A-2004-207696 | 7/2004 |
| JP | A-2004-207711 | 7/2004 |
| JP | A-2004-260115 | 7/2004 |
| JP | A-2004-221253 | 8/2004 |
| JP | A-2004-224421 | 8/2004 |
| JP | A-2004-228497 | 8/2004 |
| JP | A-2004-233897 | 8/2004 |
| JP | A-2004-241666 | 8/2004 |
| JP | A-2004-247527 | 9/2004 |
| JP | A-2004-259828 | 9/2004 |
| JP | A-2004-259966 | 9/2004 |
| JP | A-2004-259985 | 9/2004 |
| JP | A-2004-260043 | 9/2004 |
| JP | A-2004-260081 | 9/2004 |
| JP | A-2004-294202 | 10/2004 |
| JP | A-2004-301825 | 10/2004 |
| JP | A-2004-302043 | 10/2004 |
| JP | A-2004-303808 | 10/2004 |
| JP | A-2004-304135 | 10/2004 |
| JP | A-2004-307264 | 11/2004 |
| JP | A-2004-307265 | 11/2004 |
| JP | A-2004-307266 | 11/2004 |
| JP | A-2004-307267 | 11/2004 |
| JP | A-2004-319724 | 11/2004 |
| JP | A-2004-320017 | 11/2004 |
| JP | A-2004-327660 | 11/2004 |
| JP | A-2004-335808 | 11/2004 |
| JP | A-2004-335864 | 11/2004 |
| JP | A-2004-336922 | 11/2004 |
| JP | A-2004-342987 | 12/2004 |
| JP | A-2004-349645 | 12/2004 |
| JP | A-2004-356410 | 12/2004 |
| JP | A-2005-5295 | 1/2005 |
| JP | A-2005-5395 | 1/2005 |
| JP | A-2005-5521 | 1/2005 |
| JP | A-2005-11990 | 1/2005 |
| JP | A-2005-12228 | 1/2005 |
| JP | A-2005-018013 | 1/2005 |
| JP | A-2005-19628 | 1/2005 |
| JP | A-2005-19864 | 1/2005 |
| JP | A-2005-26634 | 1/2005 |
| JP | A-2005-503018 | 1/2005 |
| JP | A-2005-032909 | 2/2005 |
| JP | A-2005-51147 | 2/2005 |
| JP | A-2005-55811 | 3/2005 |
| JP | A-2005-64210 | 3/2005 |
| JP | A-2005-64391 | 3/2005 |
| JP | A-2005-79222 | 3/2005 |
| JP | A-2005-79584 | 3/2005 |
| JP | A-2005-79587 | 3/2005 |
| JP | A-2005-86148 | 3/2005 |
| JP | A-2005-91023 | 4/2005 |
| JP | A-2005-93324 | 4/2005 |
| JP | A-2005-93948 | 4/2005 |
| JP | A-2005-97057 | 4/2005 |
| JP | A-2005-108934 | 4/2005 |
| JP | A-2005-114882 | 4/2005 |
| JP | A-2005-116570 | 4/2005 |
| JP | A-2005-116571 | 4/2005 |
| JP | A-2005-116831 | 4/2005 |
| JP | A-2005-123586 | 5/2005 |
| JP | A-2005-127460 | 5/2005 |
| JP | A-2005-136404 | 5/2005 |
| JP | A-2005-136422 | 5/2005 |
| JP | A-2005-140999 | 6/2005 |
| JP | A-2005-150759 | 6/2005 |
| JP | A-2005-156592 | 6/2005 |
| JP | A-2005-166871 | 6/2005 |
| JP | A-2005-175176 | 6/2005 |
| JP | A-2005-175177 | 6/2005 |
| JP | A-2005-191344 | 7/2005 |
| JP | A-2005-203483 | 7/2005 |
| JP | A-2005-209705 | 8/2005 |
| JP | A-2005-209706 | 8/2005 |
| JP | A-2005-223328 | 8/2005 |
| JP | A-2005-233979 | 9/2005 |
| JP | A-2005-234359 | 9/2005 |
| JP | A-2005-236088 | 9/2005 |
| JP | A-2005-243770 | 9/2005 |
| JP | A-2005-243870 | 9/2005 |
| JP | A-2005-243904 | 9/2005 |
| JP | A-2005-251549 | 9/2005 |
| JP | A-2005-257740 | 9/2005 |
| JP | A-2005-259789 | 9/2005 |
| JP | A-2005-259830 | 9/2005 |
| JP | A-2005-268700 | 9/2005 |
| JP | A-2005-268741 | 9/2005 |
| JP | A-2005-268742 | 9/2005 |
| JP | A-2005-276932 | 10/2005 |
| JP | A-2005-302825 | 10/2005 |
| JP | A-2005-303167 | 10/2005 |
| JP | A-2005-311020 | 11/2005 |
| JP | A-2005-315918 | 11/2005 |
| JP | A-2005-340605 | 12/2005 |
| JP | A-2005-366813 | 12/2005 |
| JP | A-2005-537658 | 12/2005 |
| JP | A-2006-1821 | 1/2006 |
| JP | A-2006-5197 | 1/2006 |
| JP | A-2006-013518 | 1/2006 |
| JP | A-2006-17895 | 1/2006 |
| JP | A-2006-19702 | 1/2006 |
| JP | A-2006-24706 | 1/2006 |
| JP | A-2006-24819 | 1/2006 |
| JP | A-2006-32750 | 2/2006 |
| JP | A-2006-032963 | 2/2006 |
| JP | A-2006-41302 | 2/2006 |
| JP | A-2006-054328 | 2/2006 |
| JP | A-2006-54364 | 2/2006 |
| JP | A-2006-73584 | 3/2006 |
| JP | A-2006-73951 | 3/2006 |
| JP | A-2006-80281 | 3/2006 |
| JP | A-2006-86141 | 3/2006 |
| JP | A-2006-86442 | 3/2006 |
| JP | A-2006-508369 | 3/2006 |

(56) References Cited

FOREIGN PATENT DOCUMENTS

| | | |
|---|---|---|
| JP | 2006-113437 | 4/2006 |
| JP | A-2006-100363 | 4/2006 |
| JP | A-2006-100686 | 4/2006 |
| JP | A-2006-513442 | 4/2006 |
| JP | A-2006-120985 | 5/2006 |
| JP | A-2006-128192 | 5/2006 |
| JP | A-2006-135165 | 5/2006 |
| JP | A-2006-135312 | 5/2006 |
| JP | 2006-171426 | 6/2006 |
| JP | A-2006-140366 | 6/2006 |
| JP | A-2006-170811 | 6/2006 |
| JP | A-2006-170899 | 6/2006 |
| JP | A-2006-177865 | 7/2006 |
| JP | A-2006-184414 | 7/2006 |
| JP | A-2006-194665 | 7/2006 |
| JP | A-2006-516724 | 7/2006 |
| JP | A-2006-216917 | 8/2006 |
| JP | A-2006-228718 | 8/2006 |
| JP | A-2006-519494 | 8/2006 |
| JP | A-2006-250587 | 9/2006 |
| JP | A-2006-253572 | 9/2006 |
| JP | A-2006-269762 | 10/2006 |
| JP | A-2006-278820 | 10/2006 |
| JP | A-2006-284740 | 10/2006 |
| JP | A-2006-289684 | 10/2006 |
| JP | A-2006-309243 | 11/2006 |
| JP | 2006-343023 | 12/2006 |
| JP | A-2006-344747 | 12/2006 |
| JP | A-2006-349946 | 12/2006 |
| JP | A-2006-351586 | 12/2006 |
| JP | A-2007-5830 | 1/2007 |
| JP | A-2007-019079 | 1/2007 |
| JP | A-2007-43980 | 2/2007 |
| JP | A-2007-48819 | 2/2007 |
| JP | A-2007-51300 | 3/2007 |
| JP | A-2007-505488 | 3/2007 |
| JP | A-2007-87306 | 4/2007 |
| JP | A-2007-93546 | 4/2007 |
| JP | A-2007-103153 | 4/2007 |
| JP | A-2007-113939 | 5/2007 |
| JP | A-2007-119851 | 5/2007 |
| JP | A-2007-120333 | 5/2007 |
| JP | A-2007-120334 | 5/2007 |
| JP | A-2007-142313 | 6/2007 |
| JP | A-2007-144864 | 6/2007 |
| JP | A-2007-150295 | 6/2007 |
| JP | A-2007-170938 | 7/2007 |
| JP | A-2007-187649 | 7/2007 |
| JP | A-2007-207821 | 8/2007 |
| JP | A-2007-227637 | 9/2007 |
| JP | A-2007-227918 | 9/2007 |
| JP | A-2007-235041 | 9/2007 |
| JP | A-2007-258691 | 10/2007 |
| JP | A-2007-274881 | 10/2007 |
| JP | A-2007-280623 | 10/2007 |
| JP | A-2007-295702 | 11/2007 |
| JP | A-2008-3740 | 1/2008 |
| JP | A-2008-047744 | 2/2008 |
| JP | A-2008-58580 | 3/2008 |
| JP | A-2008-64924 | 3/2008 |
| JP | A-2008-102134 | 5/2008 |
| JP | A-2008-103737 | 5/2008 |
| JP | A-2008-180492 | 8/2008 |
| JP | A-2008-258605 | 10/2008 |
| JP | A-2009-17540 | 1/2009 |
| JP | A-2009-60339 | 3/2009 |
| JP | A-2009-105396 | 5/2009 |
| JP | A-2009-111369 | 5/2009 |
| JP | A-2009-117801 | 5/2009 |
| JP | A-2009-117812 | 5/2009 |
| JP | A-2010-034486 | 2/2010 |
| KR | 2002-0092207 | 12/2002 |
| WO | WO 97/11411 A1 | 3/1997 |
| WO | WO 98/24115 A1 | 6/1998 |
| WO | WO 98/59364 A1 | 12/1998 |
| WO | WO 99/23692 A1 | 5/1999 |
| WO | WO 99/27568 A1 | 6/1999 |
| WO | WO 99/31716 A1 | 6/1999 |
| WO | WO 99/34255 A1 | 7/1999 |
| WO | WO 99/49366 A1 | 9/1999 |
| WO | WO 99/49504 | 9/1999 |
| WO | WO 99/49504 A1 | 9/1999 |
| WO | WO 99/50712 A1 | 10/1999 |
| WO | WO 99/66370 A1 | 12/1999 |
| WO | WO 00/11706 A1 | 3/2000 |
| WO | WO 00/67303 | 4/2000 |
| WO | WO 00/67303 A1 | 11/2000 |
| WO | WO 01/03170 A1 | 1/2001 |
| WO | WO 01/10137 A1 | 2/2001 |
| WO | WO 01/22480 A1 | 3/2001 |
| WO | WO 01/27978 A1 | 4/2001 |
| WO | WO 01/59502 A1 | 8/2001 |
| WO | WO 01/65296 A1 | 9/2001 |
| WO | WO 02/16993 A1 | 2/2002 |
| WO | WO 02/063664 A1 | 8/2002 |
| WO | WO 02/069049 A2 | 9/2002 |
| WO | WO 02/080185 A1 | 10/2002 |
| WO | WO 02/084720 A2 | 10/2002 |
| WO | WO 02/084850 A1 | 10/2002 |
| WO | WO 02/101804 A1 | 12/2002 |
| WO | WO 02/103766 A1 | 12/2002 |
| WO | WO 03/023832 A1 | 3/2003 |
| WO | WO 03/023833 A1 | 3/2003 |
| WO | WO 03/063212 A1 | 7/2003 |
| WO | WO 03/077036 A1 | 9/2003 |
| WO | WO 03/085708 A1 | 10/2003 |
| WO | WO 2004/051220 A2 | 6/2004 |
| WO | WO 2004/051717 A1 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/061488 A1 | 7/2004 |
| WO | WO 2004/071070 A2 | 8/2004 |
| WO | WO 2004/077164 A1 | 9/2004 |
| WO | WO 2004/086468 A1 | 10/2004 |
| WO | WO 2004/086470 A1 | 10/2004 |
| WO | WO 2004/090956 A1 | 10/2004 |
| WO | WO 2004/091079 A1 | 10/2004 |
| WO | WO 2004/094940 A1 | 11/2004 |
| WO | WO 2004/104654 A1 | 12/2004 |
| WO | WO 2004/105106 A1 | 12/2004 |
| WO | WO 2004/105107 A1 | 12/2004 |
| WO | WO 2004/107048 A2 | 12/2004 |
| WO | WO 2004/107417 A1 | 12/2004 |
| WO | WO 2004/109780 A1 | 12/2004 |
| WO | WO 2004/114380 A1 | 12/2004 |
| WO | WO 2005/006415 A1 | 1/2005 |
| WO | WO 2005/006418 A1 | 1/2005 |
| WO | WO 2005/008754 A1 | 1/2005 |
| WO | WO 2005/022615 A1 | 3/2005 |
| WO | WO 2005/026843 A2 | 3/2005 |
| WO | WO 2005/026843 A3 | 3/2005 |
| WO | WO 2005/029559 A1 | 3/2005 |
| WO | WO 2005/036619 A1 | 4/2005 |
| WO | WO 2005/036620 A1 | 4/2005 |
| WO | WO 2005-036622 A1 | 4/2005 |
| WO | WO 2005/036623 A1 | 4/2005 |
| WO | WO 2005/041276 A1 | 5/2005 |
| WO | WO 2005/048325 A1 | 5/2005 |
| WO | WO 2005/048326 A1 | 5/2005 |
| WO | WO 2005/057636 A1 | 6/2005 |
| WO | WO 2005/067013 A1 | 7/2005 |
| WO | WO 2005/071717 A1 | 8/2005 |
| WO | WO 2005/076321 A1 | 8/2005 |
| WO | WO 2005/076323 A1 | 8/2005 |
| WO | WO 2005/081291 A1 | 9/2005 |

(56) References Cited

FOREIGN PATENT DOCUMENTS

| | | |
|---|---|---|
| WO | WO 2005/081292 A1 | 9/2005 |
| WO | WO 2005/104195 A1 | 11/2005 |
| WO | WO 2006-006730 A1 | 1/2006 |
| WO | WO 2006-016551 A1 | 2/2006 |
| WO | WO 2006/019124 A1 | 2/2006 |
| WO | WO 2006-025341 A1 | 3/2006 |
| WO | WO 2006-028188 A1 | 3/2006 |
| WO | WO 2006-030727 A1 | 3/2006 |
| WO | WO 2006/030910 A1 | 3/2006 |
| WO | WO 2006/035775 A1 | 4/2006 |
| WO | WO 2006-049134 A1 | 5/2006 |
| WO | WO 2006/051909 A1 | 5/2006 |
| WO | WO 2006-064851 A1 | 6/2006 |
| WO | WO 2006-068233 A1 | 6/2006 |
| WO | WO 2006-077958 A1 | 7/2006 |
| WO | WO 2006/085524 A1 | 8/2006 |
| WO | WO 2006/085626 A1 | 8/2006 |
| WO | WO 2006/097135 | 9/2006 |
| WO | WO 2006/100889 A1 | 9/2006 |
| WO | WO 2006-118108 A1 | 11/2006 |
| WO | WO 2007/003563 A1 | 1/2007 |
| WO | WO 2007/004567 A1 | 1/2007 |
| WO | WO 2007-018127 A1 | 2/2007 |
| WO | WO 2007/055237 A1 | 5/2007 |
| WO | WO 2007/055373 A1 | 5/2007 |
| WO | WO 2007/058188 A1 | 5/2007 |
| WO | WO 2007/066692 A1 | 6/2007 |
| WO | WO 2007/066758 A1 | 6/2007 |
| WO | WO 2007/100081 A1 | 7/2007 |
| WO | WO 2007/097198 A1 | 8/2007 |
| WO | WO 2007/132862 A1 | 11/2007 |
| WO | WO 2007/141997 A1 | 12/2007 |
| WO | WO 2008/015973 A1 | 2/2008 |
| WO | WO 2008/041575 A1 | 4/2008 |
| WO | WO 2008/059748 A1 | 5/2008 |
| WO | WO 2008/061681 | 5/2008 |
| WO | WO 2008/065977 A1 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/131928 A1 | 11/2008 |
| WO | WO 2008/139848 A1 | 11/2008 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

Office Action dated Jul. 5, 2011 in Chinese Patent Application No. 200880100940.0.
Office Action dated Jun. 30, 2011 in Chinese Patent Application No. 200880021453.5.
Office Action dated Jul. 28, 2011 in U.S. Appl. No. 12/252,283.
Office Action dated Jul. 19, 2011 in U.S. Appl. No. 12/191,821.
Office Action dated Jul. 26, 2011 in Chinese Application No. 200880020867.6.
Notice of Allowance dated Nov. 28, 2011 in U.S. Appl. No. 12/952,197.
Dec. 15, 2011 Notice of Allowance issued in U.S. Appl. No. 12/245,021.
Dec. 20, 2011 Office Action issued in CN Application No. 200980101546.3 (with English translation).
Feb. 7, 2012 Notice of Allowance issued in U.S. Appl. No. 12/191,821.
Office Action dated Nov. 15, 2011 in U.S. Appl. No. 12/252,274.
Office Action dated Dec. 8, 2011 in U.S. Appl. No. 12/256,055.
Office Action dated Nov. 3, 2011 in Chinese Patent Application No. 200880015567.9.
Office Action dated Dec. 12, 2011 in European Patent Application No. 08 837 064.8.
Office Action dated Nov. 17, 2011 in Chinese Patent Application No. 200880024375.4.
Jan. 15, 2009 International Search Report issued in International Application No. PCT/JP2008/068319.
Mar. 25, 2009 International Search Report issued in International Application No. PCT/JP2008/066803.
Jan. 16, 2009 Invitation to Pay Additional Fees Relating to the results of the Partial International Search Report issued in International Application No. PCT/JP2008/066803.
May 25, 2009 International Search Report issued in International Application No. PCT/JP2008/069704.
Mar. 6, 2009 Invitation to Pay Additional Fees Relating to the results of the Partial International Search Report issued in International Application No. PCT/JP2008/069704.
Jan. 26, 2009 International Search Report issued in International Application No. PCT/JP2008/068909.
Apr. 6, 2009 International Search Report issued in International Application No. PCT/JP2008/070253.
Mar. 2, 2009 International Search Report issued in International Application No. PCT/JP2008/069701.
Dec. 9, 2010 European Search Report issued in European Application No. 09015719.9.
Dec. 9, 2010 European Search Report issued in European Application No. 09015716.5.
Dec. 9, 2010 Partial European Search Report issued in European Application No. 09015718.1.
Oct. 15, 2010 Office Action issued in European Application No. 08 835 135.8.
Feb. 22, 2011 Office Action issued in European Application No. 08 830 323.5.
Dec. 8, 2010 Office Action issued in European Application No. 08 841 021.2.
Jun. 25, 2010 Office Action issued in European Application No. 08 837 064.8.
Mar. 24, 2011 Office Action issued in Chinese Application No. 200880024806.7 (with translation).
Feb. 20, 2012 Second Office Action issued in Chinese Patent Application No. 200880018312.8 (with translation).
May 18, 2011 Office Action issued in U.S. Appl. No. 12/208,155.
Jul. 27, 2011 Office Action issued in U.S. Appl. No. 12/208,155.
Mar. 24, 2011 Office Action issued in U.S. Appl. No. 12/191,821.
Jan. 3, 2011 Office Action issued in U.S. Appl. No. 12/262,930.
May 13, 2011 Office Action issued in U.S. Appl. No. 12/952,197.
Mar. 31, 2011 Notice of Allowance issued in U.S. Appl. No. 12/252,274.
Sep. 1, 2010 Office Action issued in U.S. Appl. No. 12/252,274.
Feb. 24, 2012 Notice of Allowance issued in U.S. Appl. No. 12/252,283.
Gao, et al., "Research on High-Quality Projecting Reduction Lithography System Based on Digital Mask Technique," Elsevier GmbH, Optik (Jan. 2005), vol. 116, pp. 303-310.
Aug. 26, 2011 Office Action issued in U.S. Appl. No. 12/245,021.
May 29, 2012 Office Action issued in U.S. Appl. No. 13/417,602.
May 9, 2012 Office Action issued in European Patent Application No. 08 830 323.5.
May 23, 2012 Office Action issued in U.S. Appl. No. 12/191,821.
Jun. 20, 2012 Office Action issued in Chinese Patent Application No. 200880100940.0 (with translation).
Jul. 27, 2012 Search Report issued in European Patent Application No. 12171299.6.
Jun. 18, 2012 Office Action issued in Chinese Patent Application No. 200880021453.5 (with translation).
Aug. 14, 2012 Notice of Allowance issued in U.S. Appl. No. 12/252,274.
Aug. 24, 2012 Office Action issued in U.S. Appl. No. 12/245,021.
Aug. 27, 2012 Office Action issued in U.S. Appl. No. 12/256,055.
Jul. 26, 2012 Office Action issued in Chinese Application No. 200880020867.6.
Sep. 14, 2012 Office Action issued in U.S. Appl. No. 13/484,051.
Oct. 2, 2012 Search Report issued in European Application No. 12173803.3.
Sep. 28, 2012 Notice of Allowance issued in U.S. Appl. No. 12/252,283.
Oct. 17, 2012 Office Action issued in European Patent Application No. 08841021.2.

(56) References Cited

OTHER PUBLICATIONS

Oct. 18, 2012 Search Report issued in European Application No. 09015718.1.
Oct. 30, 2012 Search Report issued in European Application No. 12173802.5.
Oct. 17, 2012 Office Action issued in European Application No. 09015716.5.
Oct. 10, 2012 Office Action issued in Chinese Application No. 200880015567.9 (w/ translation).
Feb. 22, 2012 Office Action issued in Chinese Application No. 200880020867.6 (w/ translation).
Nov. 20, 2012 Office Action issued in Japanese Application No. P2008-261214 (w/ translation).
Nov. 20, 2012 Office Action issued in Japanese Application No. P2008-261215 (w/ translation).
Nov. 27, 2012 Office Action issued in U.S. Appl. No. 12/252,274.
Dec. 26, 2012 Office Action in Chinese Patent Application No. 200980101546.3 (with translation).
Jan. 15, 2013 Notice of Allowance issued in U.S. Appl. No. 12/191,821.
Jan. 16, 2013 Notice of Allowance issued in U.S. Appl. No. 13/417,602.
Jan. 23, 2013 Notice of Allowance issued in U.S. Appl. No. 12/952,197.
Jan. 23, 2013 Notice of Allowance issued in U.S. Appl. No. 12/252,283.
Jan. 15, 2013 Office Action issued in Japanese Patent Application No. P2008-259522 (with translation).
Jan. 31, 2013 Office Action issued in Chinese Patent Application No. 200880021453.5 (with translation).
Feb. 19, 2013 Office Action issued in Japanese Patent Application No. 2010-514429 (with translation).
Mar. 11, 2013 Office Action issued in European Patent Application No. 08847031.5.
Mar. 19, 2013 Office Action issued in European Patent Application No. 08830323.5.
Mar. 12, 2013 Office Action issued in Chinese Patent Application No. 200880024806.7 (with translation).
Apr. 5, 2013 Notice of Allowance issued in U.S. Appl. No. 13/484,051.
Apr. 29, 2013 Notice of Allowance issued in U.S. Appl. No. 12/252,274.
May 10, 2013 Office Action issued in European Patent Application No. 12171299.6.
Apr. 3, 2013 Office Action issued in Chinese Patent Application No. 200880100940.0 (with translation).
May 14, 2013 Office Action issued in Japanese Patent Application No. P2010-506474 (with translation).
Sep. 21, 2012 Search Report issued in European Application No. 12173801.7.
Oct. 23, 2012 Notice of Allowance issued in Japanese Application No. P2008-263405 (w/ translation).
Jun. 17, 2013 Office Action issued in European Patent Application No. 12173802.5.
Apr. 30, 2014 Office Action issued in Japanese Patent Application No. P2013-055204 (with English Translation).
Aug. 27, 2014 Office Action issued in Korean Patent Application No. 10-2010-7005948 (with English translation).
Jul. 2, 2014 Office Action issued in Chinese Patent Application No. 201310052891.0.
Jul. 2, 2014 Office Action issued in Chinese Patent Application No. 201310052720.8.
May 5, 2015 Office Action issued in Chinese Application No. 201310052720.8.
May 6, 2015 Office Action issued in Chinese Application No. 201310052891.0.
May 22, 2015 Office Action issued in Korean Application No. 10-2015-7005375.

* cited by examiner

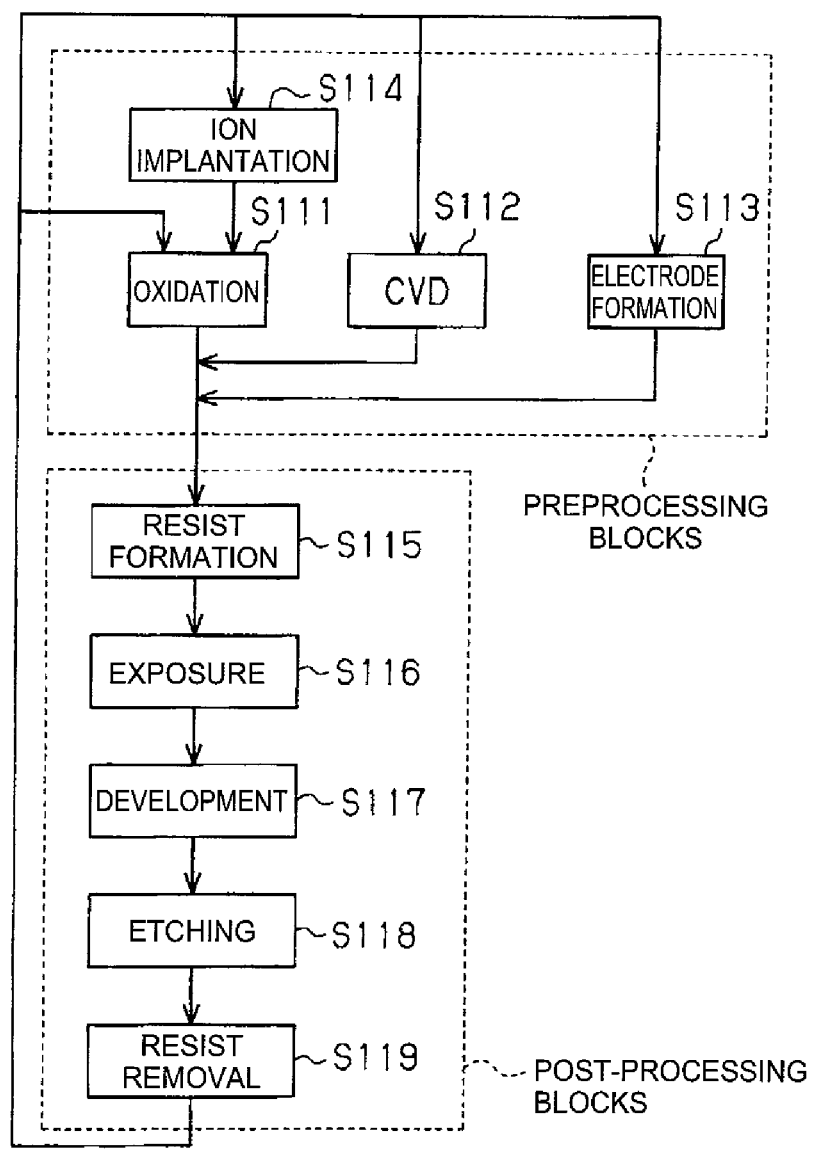

ize: 0.875em;">
ILLUMINATION OPTICAL APPARATUS, EXPOSURE APPARATUS, AND DEVICE MANUFACTURING METHOD

CROSS-REFERENCE TO RELATED APPLICATIONS

This application is based upon and claims the benefit of priorities from Japanese Patent Application No. 2007-266691, filed on Oct. 12, 2007 and U.S. Provisional Application No. 60/996,035, filed on Oct. 25, 2007, the entire contents of which are incorporated herein by reference.

BACKGROUND OF THE INVENTION

1. Field

The present invention relates to an illumination optical apparatus for illuminating an illumination target object, an exposure apparatus having the illumination optical apparatus, and a device manufacturing method using the exposure apparatus.

2. Description of the Related Art

The conventional exposure apparatus, for example, described in Japanese Patent Application Laid-open No. 2002-353105 was proposed as an exposure apparatus to be used in manufacture of micro devices such as semiconductor integrated circuits. This exposure apparatus has an illumination optical apparatus for illuminating a mask such as a reticle on which a predetermined pattern is formed; and a projection optical apparatus for projecting a pattern image formed by illumination of the mask with the illumination optical apparatus, onto a substrate such as a wafer or a glass plate coated with a photosensitive material.

The illumination optical apparatus has a spatial light modulation member for adjusting a pupil luminance distribution on an illumination target surface of the mask. This spatial light modulation member has a plurality of reflecting optical elements arranged in an array form, and a reflecting surface of each reflecting optical element is coated with a reflecting film. Each reflecting optical element is so configured that exposure light from a light source is reflected toward the mask by the reflecting surface thereof.

SUMMARY

Embodiments of the present invention provide an illumination optical apparatus, an exposure apparatus, and a device manufacturing method capable of contributing to increase in manufacture efficiency of devices with increase in output of the light source even in the case where the spatial light modulation member is arranged in the optical path of the light emitted from the light source.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

An illumination optical apparatus according to an embodiment of the present invention is an illumination optical apparatus which guides light emitted from a light source and traveling along a predetermined optical path, to an illumination target object, the illumination optical apparatus comprising: a plurality of spatial light modulation members in which a plurality of reflecting optical elements each including a movable reflecting surface are arranged in an array form; wherein at least one of the spatial light modulation members is arranged in the optical path.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 10 is a detailed flowchart about processing of a substrate in the case of semiconductor devices.

DESCRIPTION

First Embodiment

The first embodiment as a specific example of the present invention will be described below on the basis of FIGS. 1 to 4.

Figure 1:
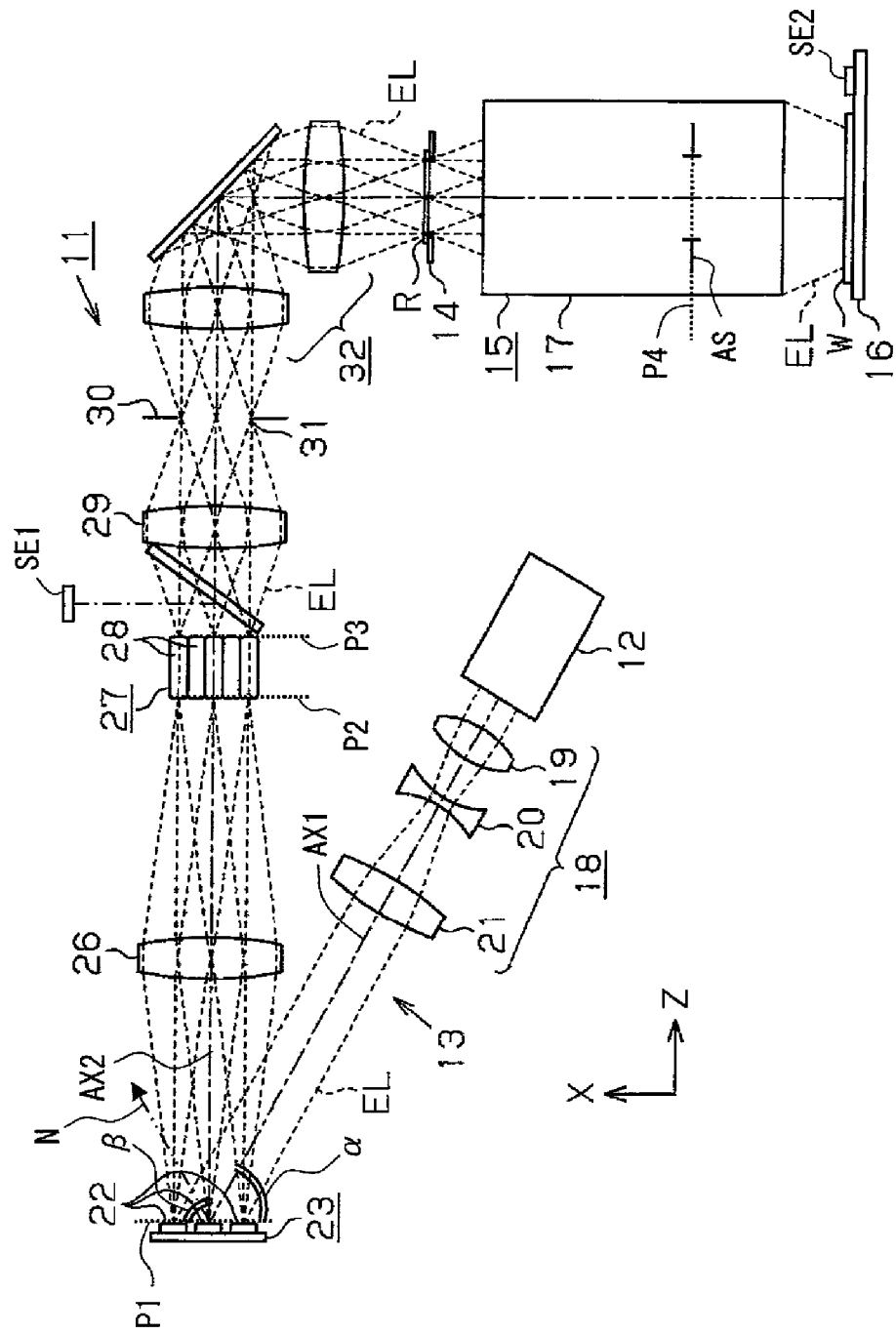
FIG. 1 is a schematic configuration diagram showing an exposure apparatus in the first embodiment.

As shown in FIG. 1, an exposure apparatus 11 of the present embodiment is composed of an illumination optical apparatus 13 to which exposure light EL from an exposure light source 12 is supplied, a reticle stage 14 holding a reticle R (which may be a photomask) on which a predetermined pattern is formed, a projection optical device 15, and a wafer stage 16 holding a wafer W having a surface coated with a photosensitive material such as a resist. The exposure light source 12 consists of, for example, an ArF excimer laser light source. The exposure light EL emitted from the exposure light source 12 passes through the illumination optical apparatus 13 to be so adjusted as to evenly illuminate the pattern on the reticle R.

The reticle stage 14 is arranged on the object plane side of the projection optical device 15 described later, so that a mounting surface of the reticle R is approximately perpendicular to the direction of the optical axis of the projection optical device 15. This projection optical device 15 has a barrel 17 internally filled with an inert gas such as nitrogen, and a plurality of lenses not shown are disposed along the optical path of the exposure light EL in this barrel 17. An image of the pattern on the reticle R illuminated with the exposure light EL is projected and transferred in a reduced state at a predetermined reducing rate through the projection optical device 15, onto the wafer W on the wafer stage 16. The optical path herein refers to a path in which light is intended to pass in a use state.

The illumination optical apparatus 13 of the present embodiment will be described below on the basis of FIG. 1.

The illumination optical apparatus 13 is provided with a relay optical system 18 into which the exposure light EL emitted from the exposure light source 12 is incident. This relay optical system 18 is typically composed of a first positive lens 19, a negative lens 20, and a second positive lens 21 arranged along the optical axis AX1 in the order named from the exposure light source 12 side. The exposure light EL incident from the exposure light source 12 into the relay optical system 18 is emitted in an enlarged state of its sectional shape to the opposite side to the exposure light source 12.

Figure 2:
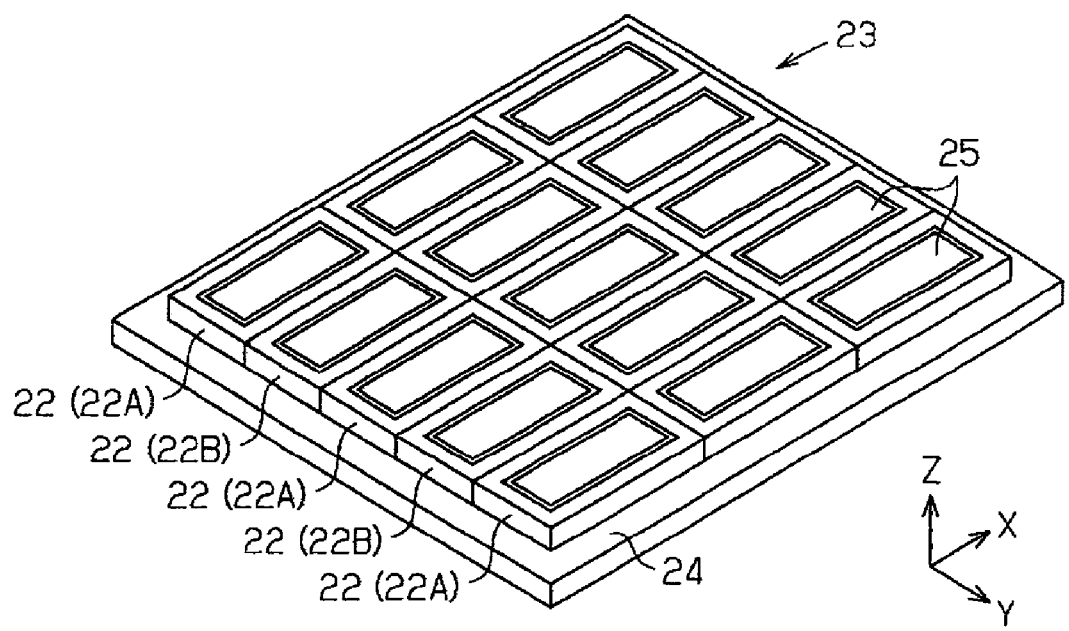
FIG. 2 is a schematic perspective view showing a movable multi-mirror in the first embodiment.

In the illumination optical apparatus 13, a reflecting optical system 23 has a configuration in which a plurality of movable multi-mirrors 22 (only fifteen of which are illustrated in FIG. 2) are arranged in an array form, as shown in FIGS. 1 and 2, and is disposed in an unmovable state on the opposite side to the exposure light source 12 with respect to the relay optical system 18. This reflecting optical system 23 has a base 24 of a planar plate shape and, mirror rows in each of which three movable multi-mirrors 22 are juxtaposed in the X-direction, are formed in five lines in the Y-direction on the base 24. Each movable multi-mirror 22 is provided with an effective region 25 of a nearly rectangular shape capable of reflecting the exposure light EL and the exposure light EL impinges upon each of the effective regions 25 of all the movable multi-mirrors 22. The above-described arrangement of movable multi-mirrors 22 (i.e., three in the X-direction and five in the Y-direction) is just an example, and the arrangement and number of movable multi-mirrors 22 may be those different from the above-described arrangement.

The exposure light EL reflected on each movable multi-mirror 22 travels through a condenser optical system (distribution forming optical system) 26 arranged along the optical axis AX2 making a predetermined angle with the optical axis AX1 on the entrance side of each movable multi-mirror 22, into an optical integrator (fly's eye lens in the present embodiment) 27. The front focal point of the condenser optical system 26 is located near an arrangement plane P1 where each mirror element in each movable multi-mirror 22 is located, and the rear focal point of the condenser optical system 26 is located on a plane P2 near an entrance surface of the optical integrator 27. This optical integrator 27 has a configuration in which a plurality of lens elements 28 (only five of which are shown in FIG. 1) are two-dimensionally arranged. The exposure light EL incident into the optical integrator 27 is split into a plurality of beams by the lens elements 28. As a consequence, a large number of light source images are formed on the right side plane (or image plane) in FIG. 1 of the optical integrator 27.

The exposure light EL emitted from the optical integrator 27, which consists of beams emitted from the large number of light source images, travels through a condenser optical system 29 to illuminate a mask blind 30 in a superposedly condensed state. The exposure light EL having passed through an aperture 31 of the mask blind 30 travels through a condenser optical system 32 to illuminate a reticle R. A pupil luminance distribution in an illumination region illuminated with the exposure light EL on the reticle R is appropriately adjusted.

In the present embodiment, the reticle R arranged on an illumination target surface of the illumination optical system IL is illuminated by Köhler illumination, using the secondary light source formed by the optical integrator 27, as a light source. For this reason, a position P3 where the secondary light source is formed is optically conjugate with a position P4 of an aperture stop AS of the projection optical system PL and the forming plane P3 of the secondary light source can be called an illumination pupil plane of the illumination optical system IL. Typically, the illumination target surface (a plane where the mask M is arranged, or a plane where the wafer W is arranged in the case where the illumination optical system is considered to include the projection optical system PL) is an optical Fourier transform plane of the illumination pupil plane.

In the present embodiment, a splitting mirror for reflecting part of the exposure light EL is provided on the exit side of the optical integrator 27 and an exposure amount sensor SE is provided so as to receive light reflected by the splitting mirror. The exposure amount can be controlled by monitoring the output of the exposure amount sensor SE1.

In the present embodiment, the wafer stage 16 is provided with a pupil luminance distribution detector SE2 for monitoring the pupil luminance distribution of exposure light arriving at the wafer W. The configuration of this pupil intensity distribution detector is disclosed, for example, in Japanese Patent Application Laid-open No. 2006-59834 and U.S. Pat. Published Application No. 2008/0030707 corresponding thereto. U.S. Pat Published Application No. 2008/0030707 is incorporated herein by reference.

The configuration of movable multi-mirror 22 will be described below on the basis of FIGS. 2 to 4.

Figure 3:
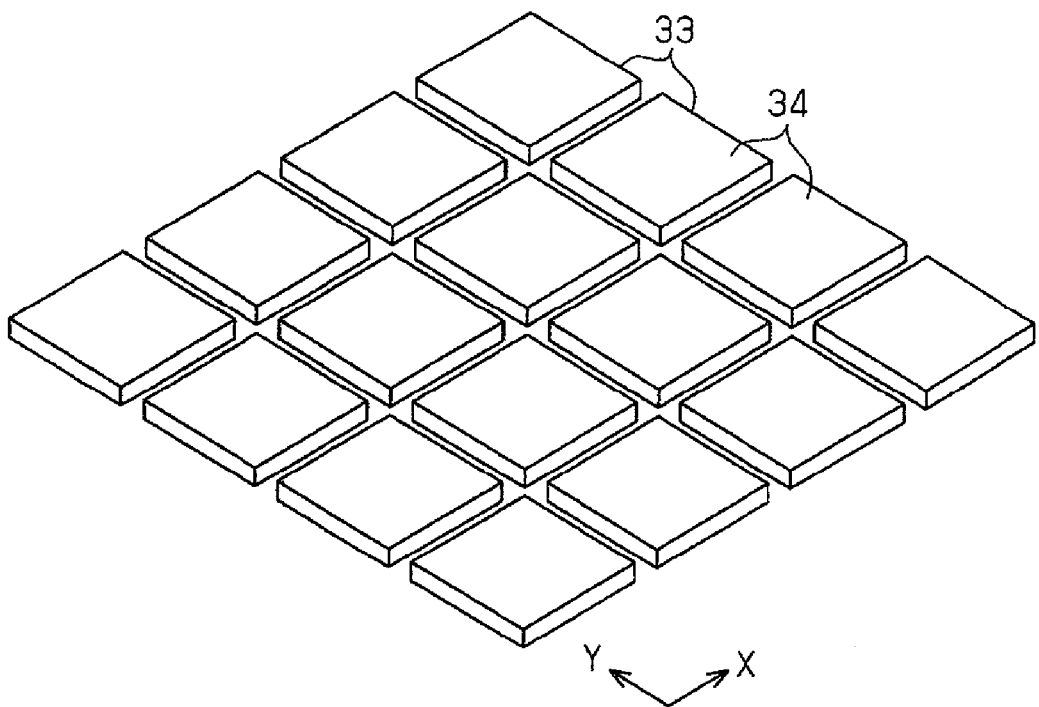
FIG. 3 is a schematic perspective view showing an array form of mirror elements forming a movable multi-mirror.

As shown in FIGS. 2 and 3, the movable multi-mirror 22 has a plurality of mirror elements 33 of a square shape on their plan view with a reflecting surface 34 coated with a reflecting film, and the mirror elements 33 are arranged in an array form. In order to reduce a loss in light quantity in the reflecting optical system 23, these mirror elements 33 are arranged with a gap as small as possible between mirror elements 33 adjacent to each other. Each mirror element 33 is movable to change an angle of inclination to the optical path of exposure light EL. In the description hereinafter, the "angle of inclination of the mirror element 33 to the optical path of exposure light EL" will be referred to simply as an "inclination angle of mirror element 33." As shown in FIG. 1, the mirror elements of the movable multi-mirrors 22 are arranged along the arrangement plane P1 located on the XY plane.

The reflecting optical system 23 of the present embodiment is composed of plural types (two types in the present embodiment) of movable multi-mirrors 22A, 22B. Specifically, the mirror row located on the nearest side in the Y-direction in FIG. 2, the mirror row located in the middle among the mirror rows, and the mirror row located on the farthest side each are composed of first movable multi-mirrors 22A, while the other mirror rows each are composed of second movable multi-mirrors 22B. The first movable multi-mirror 22A is composed of a plurality of mirror elements 33 rotatable around a first axis S1, as shown in FIG. 4. On the other hand, the second movable multi-mirror 22B is composed of a plurality of mirror elements 33 rotatable around a second axis S2 nearly perpendicular to the first axis S1. The first axis S1 is an axis corresponding to a first diagonal line among the two diagonal lines of the mirror element 33 and the second axis S2 is an axis corresponding to a second diagonal line perpendicular to the first diagonal line.

A drive unit for the mirror element 33 forming the first movable multi-mirror 22A will be described below on the basis of FIG. 4. Since a drive unit for the mirror element 33 forming the second movable multi-mirror 22B has the same configuration as the drive unit for the mirror element 33 forming the first movable multi-mirror 22A except that the mirror element 33 is rotated around the second axis S2, the description thereof is omitted herein.

Figure 4:
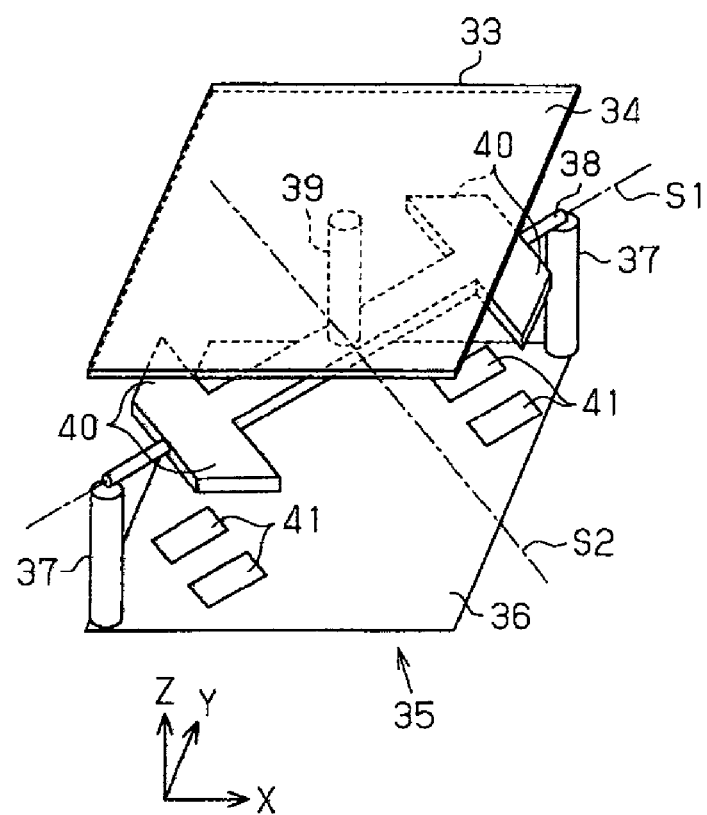
FIG. 4 is a schematic perspective view showing a configuration of a drive unit to drive a mirror element.

As shown in FIG. 4, the drive unit 35 for the mirror element 33 forming the first movable multi-mirror 22A is provided with a base member 36 of a square plate shape corresponding to the shape of the mirror element 33, and support members 37 stand at two corners located on the first axis S1 out of the four corners of the base member 36. The drive unit 35 is provided with a hinge member 38 extending in the extending direction of the first axis S1, and the hinge member 38 is supported in a rotatable state around the first axis S1 on the support members 37. A projection 39 projecting in the Z-direction is provided in the central part in the longitudinal direction of the hinge member 38 and the mirror element 33 is fixed through the projection 39 to the hinge member 38.

First electrode portions 40 extending in two directions perpendicular to the first axis S1 from the hinge member 38 are formed on the first end side and on the second end side, respectively, in the longitudinal direction of the hinge member 38. Second electrode portions 41 are also provided at respective positions corresponding to the four first electrode portions 40, on the base member 36. When a potential difference is made between each pair of first electrode portion 40 and second electrode portion 41 in a mutually corresponding relation, the hinge member 38 rotates around the first axis S1 because of electrostatic forces acting based on these potential differences, whereby the mirror element 33 rotates around the first axis S1. Namely, the inclination angle of mirror element 33 can be controlled by adjusting each of the potential differences between each of the pairs of electrode portions 40, 41 in the mutually corresponding relation.

The exposure light EL incident to each of the movable multi-mirrors 22A, 22B is folded into a direction corresponding to the inclination angle of each mirror element 33 to which the light is incident. Since the condenser optical system 26 which can be regarded as a distribution forming optical system has a function to convert the angle information of incident light into position information, the sectional shape of exposure light EL on the plane P2 near the entrance surface of the optical integrator 27 is changed into any size and shape by individually adjusting the inclination angles of the respective mirror elements 33. This condenser optical system 26 superimposes part of the exposure light EL having passed via the movable multi-mirrors 22A, and part of the exposure light having passed via the movable multi-mirrors 22B, at least in part on the plane P2. Since the exposure light beams from the plurality of movable multi-mirrors 22A, 22B are superimposed, it is feasible to enhance evenness of light intensity in the superimposed region.

In other words, the light spatially angle-modulated by the movable multi-mirrors 22A, 22B is converted into the spatially modulated light by the condenser optical system 26, to form the pupil intensity distribution as a desired light intensity distribution on the plane P2.

The pupil intensity distribution is a light intensity distribution (luminance distribution) on the illumination pupil plane of the illumination optical system or on a plane optically conjugate with the illumination pupil plane. When the number of wavefront divisions by the optical integrator 27 is relatively large, a high correlation is demonstrated between the overall light intensity distribution formed on the plane P2 near the entrance surface of the optical integrator 27 and the overall light intensity distribution (pupil intensity distribution) of the entire secondary light source. For this reason, light intensity distributions on the entrance surface of the optical integrator 27 and on the planes P3, P4 optically conjugate with the entrance surface can also be called pupil intensity distributions.

In this manner, the secondary light source with the light intensity distribution approximately equal to the exposure light EL with the sectional shape modified in the desired size and shape is formed on the plane P3 which is also the rear focal plane of the optical integrator 27. Furthermore, a light intensity distribution corresponding to the pupil intensity distribution formed on the plane P3 is also formed at other illumination pupil positions optically conjugate with the rear focal plane of the optical integrator 27, i.e., at the pupil position of the condenser optical system 32 and at the pupil position of the projection optical system PL.

The pupil intensity distribution can be, for example, a light intensity distribution of an annular shape or a multi-polar shape (dipolar, quadrupolar, or other shape). It is feasible to implement annular illumination with formation of the annular pupil intensity distribution, or to implement multi-polar illumination with formation of the multi-polar pupil intensity distribution.

In recent years, there are strong desires for increase in power of exposure light for achieving increase in efficiency of projection of the pattern image onto the substrate and enhancement of accuracy. It is, however, very difficult to coat the reflecting surface of each reflecting optical element forming the spatial light modulation member, with a reflecting film having relatively high durability. Therefore, the reflecting surface is coated with a reflecting film having relatively low durability. For this reason, the life of the spatial light modulation member becomes shorter because the reflecting film deteriorates earlier with increase in the intensity of the exposure light emitted from the light source and because a larger quantity of light reaches a drive portion of each reflecting optical element so as to cause breakage of the drive portion. The spatial light modulation member may be replaced earlier when the intensity of the exposure light is relatively high, than when the intensity of the exposure light is relatively low.

In the exposure apparatus of the configuration as described in Japanese Patent Application Laid-open No. 2002-353105, however, the spatial light modulation member may be replaced in a state in which the drive of the exposure apparatus is temporarily suspended. Therefore, the higher the intensity of the exposure light emitted from the light source, the earlier the timing of replacement of the spatial light modulation member; there was thus the concern of decrease in efficiency of manufacture of micro devices due to the increase in output of the light source in the exposure apparatus in which the spatial light modulation member was arranged in the optical path of the exposure light.

Therefore, the present embodiment achieves the effects described below.

(1) The exposure light EL emitted from the exposure light source 12 is reflected toward the condenser optical system 26 by all the movable multi-mirrors 22A, 22B forming the reflecting optical system 23 and guided to the reticle R. For this reason, even when the exposure light EL from the exposure light source 12 has a higher power, the intensity of exposure light EL incident to each movable multi-mirror 22A, 22B is lower than in the conventional case where the entire exposure light EL emitted from the exposure light source 12 is incident to one movable multi-mirror 22. As a consequence, deterioration of the reflecting film over the reflecting surface of each mirror element 33 to which the exposure light EL is incident becomes slower than in the conventional case, so as to lengthen the lives of the movable multi-mirrors 22A, 22B. Namely, the timing of replacement of the movable multi-mirrors 22A, 22B can be delayed. Therefore, a contribution can be made to increase in manufacture efficiency of semiconductor devices with increase in output of the exposure light source 12 even in the case where the movable multi-mirrors 22A, 22B are arranged in the optical path of exposure light EL emitted from the exposure light source 12.

(2) The rotating direction of the mirror elements 33 forming the first movable multi-mirrors 22A is different from the rotating direction of the mirror elements 33 forming the second movable multi-mirrors 22B. For this reason, degrees of freedom can be higher in change in the size and shape of exposure light EL to illuminate the reticle R, than in the case where the reflecting optical system 23 is composed of only one type of movable multi-mirrors 22 (e.g., the first movable multi-mirrors 22A).

(3) Since the angle $\alpha$ between the arrangement plane P1 and the entrance-side optical axis AX1 and the angle $\beta$ between the arrangement plane P1 and the exit-side optical axis AX2 are so set as to direct zero-order reflected light N from the portions other than the mirror elements 33 of the movable multi-mirrors 22A, 22B (typically, gaps between mirror elements 33) and from the regions other than the effective regions 25 of the movable multi-mirrors 22A, 22B in the plane along the arrangement plane P1, toward the region outside the entrance pupil of the condenser optical system 26, it is feasible to prevent the zero-order reflected light from affecting the pupil luminance distribution and, typically, to prevent the zero-order reflected light from forming a light spot at a position near the optical axis AX2.

Second Embodiment

The second embodiment of the present invention will be described next according to FIG. 5. The second embodiment is different in the optical element arranged between the exposure light source 12 and the reflecting optical system 23, from the first embodiment. Therefore, only the differences from the first embodiment will be mainly explained in the description below and the components identical or equivalent to those in the first embodiment will be denoted by the same reference symbols, without redundant description.

Figure 5:
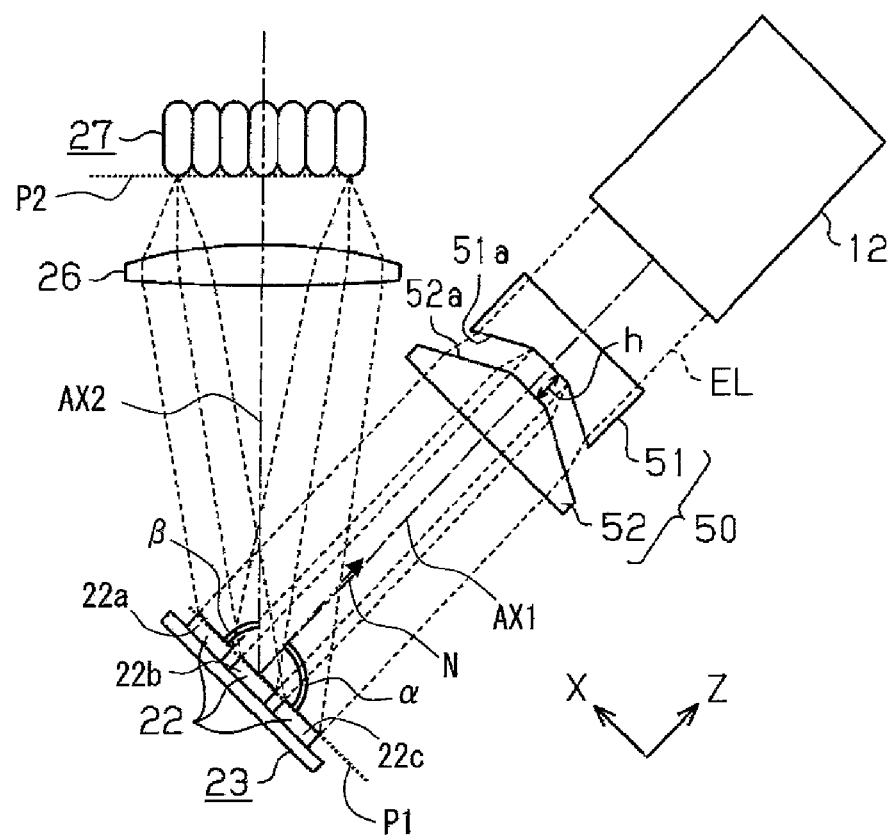
FIG. 5 is a schematic configuration diagram showing a part of an illumination optical apparatus in the second embodiment.

As shown in FIG. 5, a truncated pyramid axicon pair 50 arranged along the optical axis AX1 is provided between the exposure light source 12 and the reflecting optical system 23 and this truncated pyramid axicon pair 50 is composed of a first prism member 51 arranged on the exposure light source 12 side and a second prism member 52 arranged on the reflecting optical system 23 side. In the first prism member 51, a plane perpendicular to the optical axis of the exposure light EL is formed on the exposure light source 12 side and a refracting surface 51a of a concave shape is formed on the reflecting optical system 23 side. This refracting surface 51a is composed of a center part of a planar shape perpendicular to the optical axis of the exposure light EL, and a peripheral pyramid part corresponding to side faces of a rectangular pyramid centered on the optical axis.

In the second prism member 52, a plane perpendicular to the optical axis of the exposure light EL is formed on the reflecting optical system 23 side and a refracting surface 52a of a convex shape corresponding to the shape of the refracting surface 51a of the first prism member 51 is formed on the first prism member 51 side. This refracting surface 52a is composed of a center part of a planar shape perpendicular to the optical axis of the exposure light EL, and a peripheral pyramid part corresponding to side faces of a rectangular pyramid centered on the optical axis.

When the prism members 51, 52 are arranged with a space of a predetermined distance h between them in the optical path of exposure light EL, the exposure light EL incident from the exposure light source 12 into the truncated pyramid axicon pair 50 is split into a plurality of beams. The predetermined distance h is so adjusted that the effective regions 25 of the movable multi-mirrors 22 are located in traveling directions of the respective beams. For this reason, the beams split by the truncated pyramid axicon pair 50 are reflected toward the condenser optical system 26 on the respective effective regions 25 of the movable multi-mirrors 22 arranged in the array form.

Therefore, the present embodiment achieves the effects described below, in addition to the effects (1) and (2) in the first embodiment.

(3) The effective regions of the movable multi-mirrors 22 are located in the traveling directions of the respective beams split by the truncated pyramid axicon pair 50. For this reason, the exposure light EL is scarcely incident to the positions other than the locations of the movable multi-mirrors 22 in the reflecting optical system 23 and to the portions other than the effective regions 25 of the movable multi-mirrors 22. Therefore, a loss in light quantity can be reduced in the reflecting optical system 23. Furthermore, it is feasible to restrain promotion of deterioration of the movable multi-mirrors 22 due to increase in temperature based on illumination with the exposure light EL in the positions other than the locations of the movable multi-mirrors 22 in the reflecting optical system 23 and the portions other than the effective regions 25 of the movable multi-mirrors 22.

(4) Since no member with power (inverse of the focal length) is arranged in the optical path between the truncated pyramid axicon pair 50, which can be regarded as a beam splitter, and the movable multi-mirrors 22a, 22b, 22c, the beams that can be regarded as parallel beams are incident to the mirror elements of the movable multi-mirrors, which can enhance controllability of the pupil luminance distribution on the plane P2. On the other hand, when the beams incident to the mirror elements have an angle distribution, a light spot formed on the plane P2 by the light from the mirror elements through the condenser optical system 26 will become spread, which will make control of the pupil luminance distribution difficult.

In the present embodiment, the above-described structure can be regarded as a configuration wherein the entrance-side optical axis AX1 being an axis of the optical path of the light emitted from the light source 12 is interposed between the first position where the movable multi-mirror 22a is arranged and the second position where another movable multi-mirror 22c is arranged among the plurality of movable multi-mirrors 22. Furthermore, it can also be regarded as a configuration wherein the truncated pyramid axicon pair 50 (beam splitter) splits the beam in a plane including the optical axis AX1 (i.e., in the XY plane in the drawing).

Third Embodiment

The third embodiment of the present invention will be described below according to FIG. 6. The third embodiment is different in the optical element for splitting the exposure light EL into a plurality of optical paths, from the second embodiment. Therefore, only the differences from each of the above embodiments will be mainly explained in the description hereinafter and the components identical or equivalent to those in the above embodiments will be denoted by the same reference symbols, without redundant description.

Figure 6:
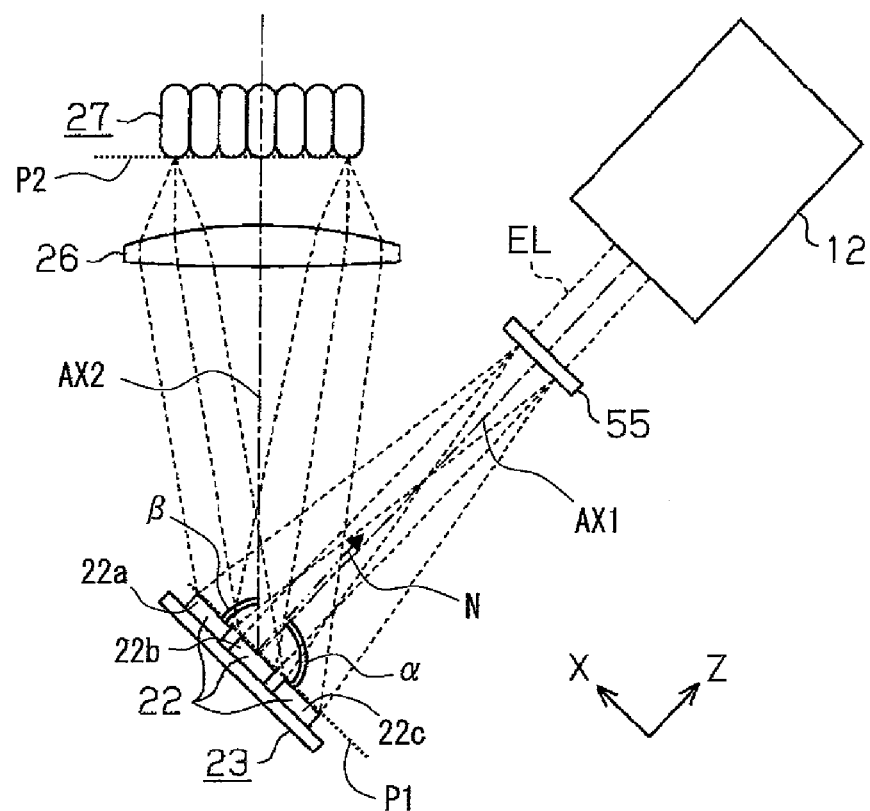
FIG. 6 is a schematic configuration diagram showing a part of an illumination optical apparatus in the third embodiment.

As shown in FIG. 6, a diffractive optical element 55 for multi-polar illumination (e.g., for quadrupolar illumination) is provided between the exposure light source 12 and the reflecting optical system 23. This diffractive optical element 55 is a transmission type diffractive optical element and is made by forming level differences at the pitch approximately equal to the wavelength of the exposure light EL in a transparent substrate. This diffractive optical element 55 is so configured that when parallel exposure light EL is incident thereto, it splits the exposure light EL into a plurality of (e.g., four) beams. As a result, multi-polar (e.g., quadrupolar) illumination regions are formed on the reflecting optical system 23. The arrangement of the diffractive optical element 55 is so adjusted that the effective regions 25 of the movable multi-mirrors 22 are located in the respective beams formed by splitting the incident exposure light EL.

The diffractive optical element 55 has a plurality of wavefront division regions in the plane of the diffractive optical element 55, in order to form an approximately even illumination region in each of the plurality of regions separated by a predetermined distance. Wavefront division regions belonging to a first set among the plurality of wavefront division regions direct the exposure light EL incident thereto, toward a first illumination region out of the plurality of illumination regions.

This causes the first illumination region to be superposedly illuminated by a plurality of beams having passed via the wavefront division regions belonging to the first set, and to have an even illuminance distribution. Similarly, wavefront division regions belonging to a second set different from the first set among the plurality of wavefront division regions direct the exposure light EL incident thereto, toward a second illumination region different from the first illumination region out of the plurality of illumination regions. This causes the second illumination region to be superposedly illuminated by a plurality of beams having passed via the wavefront division regions belonging to the second set, and to have an even illuminance distribution.

For example, the diffractive optical element 55 of the present embodiment can be the one disclosed in U.S. Pat. No. 5,850,300. U.S. Pat. No. 5,850,300 is incorporated herein by reference.

Therefore, the present embodiment achieves the effect described below, in addition to the effects (1) to (4) in the second embodiment.

(5) Since the diffractive optical element 55 makes the light intensity distribution even, the plurality of movable multi-mirrors 22 are illuminated with light of the even intensity distribution even when the intensity distribution is uneven in the cross section of the light EL emitted from the light source 12. For this reason, it is feasible to enhance the controllability of the pupil luminance distribution formed on the plane P2. On the other hand, when the movable multi-mirrors 22 are illuminated with light of an uneven intensity distribution, this unevenness of the intensity distribution will affect the pupil luminance distribution and each mirror element of the movable multi-mirrors 22 can be controlled in consideration of this unevenness. Therefore, the control becomes complicated.

Fourth Embodiment

The fourth embodiment of the present invention will be described below according to FIG. 7. The fourth embodiment is different in the optical element for splitting the exposure light EL into a plurality of optical paths, from the second and third embodiments. Therefore, only the differences from each of the above embodiments will be mainly explained in the description below and the components identical or equivalent to those in the embodiments will be denoted by the same reference symbols, without redundant description.

Figure 7:
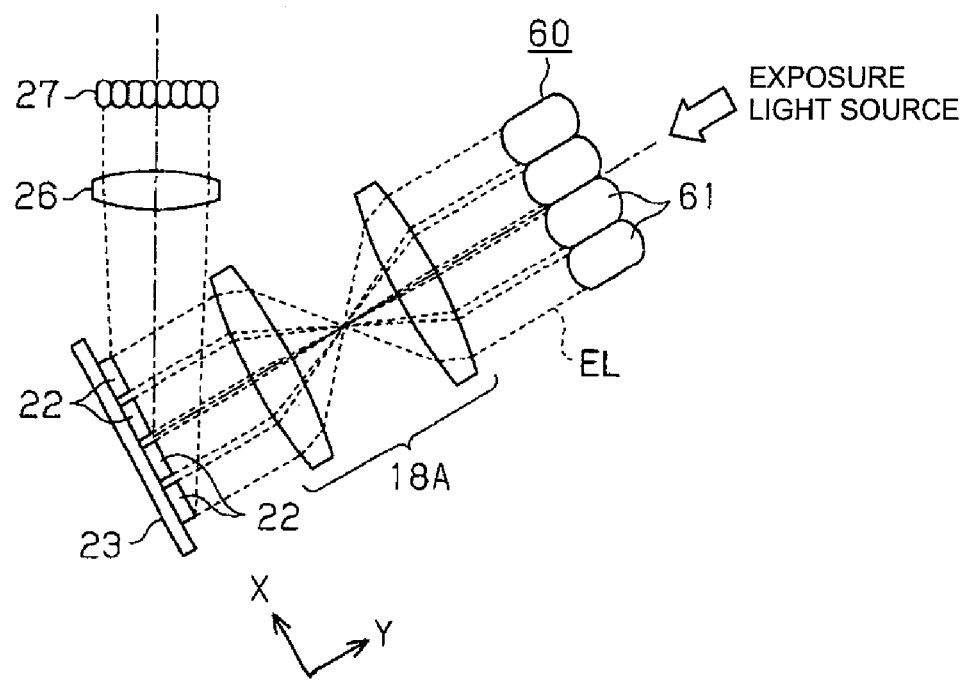
FIG. 7 is a schematic configuration diagram showing a part of an illumination optical apparatus in the fourth embodiment.

As shown in FIG. 7, a fly's eye lens 60 is provided between the exposure light source 12 and the reflecting optical system 23 and the fly's eye lens 60 is composed of a plurality of lens elements 61 (only four of which are shown in FIG. 7) as arranged two-dimensionally. A relay optical system 18A is disposed between the fly's eye lens 60 and the reflecting optical system 23 and the relay optical system 18A refocuses a plurality of beams split by the fly's eye lens 60, in respective effective regions 25 of the movable multi-mirrors 22.

In the reflecting optical system 23 of the present embodiment, the movable multi-mirrors 22 are arranged so as to positionally correspond to the respective lens elements 61 of the fly's eye lens 60. For example, in a case where the fly's eye lens 60 is one in which four lens elements are arrayed in the X-direction, the reflecting optical system 23 is so configured that four movable multi-mirrors 22 are arrayed along the X-direction. This configuration achieves the same operational effects as in each of the aforementioned second and third embodiments.

The exposure light EL incident to each movable multi-mirror 22 is mostly reflected toward the condenser optical system 26, but part of the rest (which will be referred to hereinafter as "return light") can be reflected toward the fly's eye lens 60. This return light is restrained from entering the fly's eye lens 60, by the relay optical system 18A arranged between the reflecting optical system 23 and the fly's eye lens 60. For this reason, the large number of light source images formed on the image plane of the fly's eye lens 60 can be prevented from being disturbed by the return light. As described above, the relay optical system can be regarded as a restraining member which restrains the return light from each movable multi-mirror 22 from entering the beam splitter.

Fifth Embodiment

The fifth embodiment of the present invention will be described below according to FIG. 8. The fifth embodiment is different from the first embodiment in that the exposure light EL impinges upon only some movable multi-mirrors 22 out of the movable multi-mirrors 22 forming the reflecting optical system 23. Therefore, only the differences from the first embodiment will be mainly explained in the description hereinafter and the components identical or equivalent to those in the first embodiment will be denoted by the same reference symbols, without redundant description.

Figure 8:
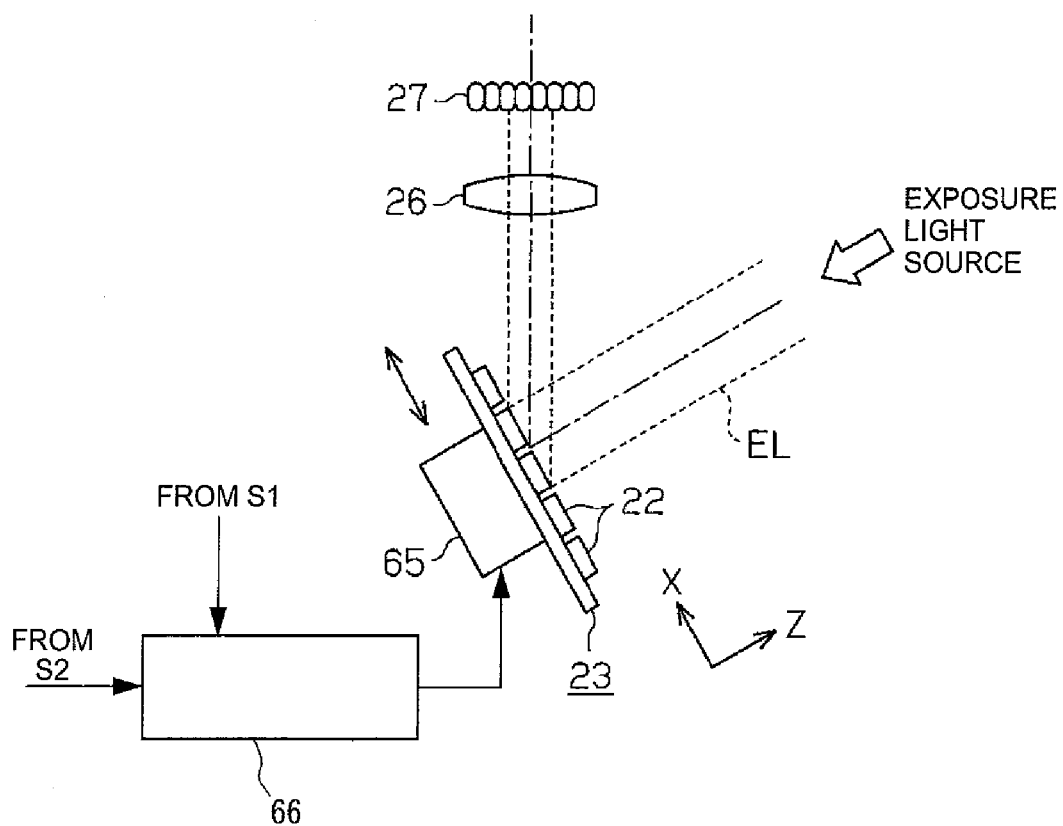
FIG. 8 is a schematic configuration diagram showing a part of an illumination optical apparatus in the fifth embodiment.

As shown in FIG. 8, the illumination optical apparatus 13 of the present embodiment is provided with a moving mechanism 65 for moving the reflecting optical system 23 along the X-direction. In the reflecting optical system 23, a plurality of movable multi-mirrors 22 (only five of which are shown in FIG. 8) are arranged along the X-direction. The exposure light EL emitted from the exposure light source 12 is incident to some movable multi-mirrors 22 (e.g., two movable multi-mirrors 22) out of these movable multi-mirrors 22, while the exposure light EL is not incident to the other movable multi-mirrors 22.

When the intensity of the exposure light EL for forming the pattern image on the wafer W becomes lowered or when the pupil luminance distribution on the wafer W becomes disturbed, based on a secular change in characteristics of the movable multi-mirrors 22 to which the exposure light EL is incident (e.g., based on deterioration of the reflecting film or deterioration of the drive unit 35 for the mirror element 33), the moving mechanism 65 is actuated to guide the exposure light EL onto the movable multi-mirrors 22 to which the exposure light EL has not been guided heretofore.

For example, in a case where the output of the exposure amount sensor SE1 monitored becomes lowered, or in a case where a deviation of the pupil luminance distribution measured by the pupil luminance distribution detector SE2, from a target value becomes off a permissible range, the control unit 66 sends a control signal to instruct replacement of the movable multi-mirrors 22, to the moving mechanism 65.

As described above, the exposure apparatus 11 of the present embodiment allows the movable multi-mirrors 22 to which the exposure light EL emitted from the exposure light source 12 is incident, to be replaced with others, without temporary suspension of drive of the exposure apparatus 11. Therefore, a contribution can be made to increase in manufacture efficiency of semiconductor devices with increase in output of the exposure light source 12, even in the case where the movable multi-mirrors 22 are arranged in the optical path of the exposure light EL emitted from the exposure light source 12.

Each of the above embodiments may be modified into another embodiment as described below.

In each embodiment, the reflecting optical system 23 may be one composed of three or more types of movable multi-mirrors 22, 22A, 22B. For example, the reflecting optical system 23 may have a configuration having third movable multi-mirrors consisting of mirror elements 33 rotatable around a third axis (e.g., an axis extending in the X-direction) intersecting with the first axis S1 and the second axis S2, in addition to the first movable multi-mirrors 22A and the second movable multi-mirrors 22B.

In each embodiment, the first movable multi-mirrors 22A may be those having mirror elements 33 rotatable around an axis parallel to the first axis S1. Similarly, the second movable multi-mirrors 22B may be those having mirror elements 33 rotatable around an axis parallel to the second axis S2.

In each embodiment, the first axis S1 does not have to be one extending along a diagonal line of each mirror element 33, but may be, for example, an axis extending along the X-direction. In this case, the second axis S2 may be an axis extending along the Y-direction.

In each embodiment, the reflecting optical system 23 may be one consisting of one type of movable multi-mirrors 22 (e.g., the first movable multi-mirrors 22A).

In the fifth embodiment, the movable multi-mirrors 22 to which the exposure light EL is incident may be switched at intervals of a predetermined time.

In the fifth embodiment, the number of movable multi-mirrors 22 to which the exposure light EL is incident, may be an arbitrary number except for two (e.g., one or three).

In the fifth embodiment, where the movable multi-mirrors 22 to which the exposure light EL is incident are switched, the apparatus may be so configured as to switch at least only one of them to which the exposure light EL is incident.

In each embodiment, the movable multi-mirrors 22 may be those having mirror elements 33 rotatable around mutually orthogonal axes (those having two degrees of freedom for inclination). The spatial light modulation members of this type can be selected, for example, from those disclosed in Japanese Patent Application Laid-open (Translation of PCT Application) No. 10-503300 and European Patent Application Publication EP 779530 corresponding thereto, Japanese Patent Application Laid-open No. 2004-78136 and U.S. Pat. No. 6,900,915 corresponding thereto, Japanese Patent Application Laid-open (Translation of PCT Application) No. 2006-524349 and U.S. Pat. No. 7,095,546 corresponding thereto, and Japanese Patent Application Laid-open No. 2006-113437. European Patent Application Publication EP 779530, U.S. Pat. No. 6,900,915, and U.S. Pat. No. 7,095,546 are incorporated herein by reference.

In each embodiment, the movable multi-mirrors 22 were those in which the orientations (inclinations) of the mirror elements arranged two-dimensionally could be individually controlled, but it is also possible, for example, to use spatial light modulation members in which heights (positions) of reflecting surfaces arranged two-dimensionally can be individually controlled. Such spatial light modulation members can be, for example, those disclosed in Japanese Patent Application Laid-open No. 6-281869 and U.S. Pat. No. 5,312,513 corresponding thereto, and in FIG. 1d in Japanese Patent Application Laid-open (Translation of PCT Application) No. 2004-520618 and U.S. Pat. No. 6,885,493 corresponding thereto. These spatial light modulation members are able to apply the same action as a diffracting surface, to incident light through formation of a two-dimensional height distribution. U.S. Pat. No. 5,312,513 and U.S. Pat. No. 6,885,493 are incorporated herein by reference.

In each embodiment, the movable multi-mirrors 22 may be modified, for example, according to the disclosure in Japanese Patent Application Laid-open (Translation of PCT Application) No. 2006-513442 and U.S. Pat. No. 6,891,655 corresponding thereto or according to the disclosure in Japanese Patent Application Laid-open (Translation of PCT Application) No. 2005-524112 and U.S. Pat. Published Application No. 2005/0095749 corresponding thereto. U.S. Pat. No. 6,891,655 and U.S. Pat. Published Application No. 2005/0095749 are incorporated herein by reference.

In each embodiment, the exposure apparatus 11 may be an exposure apparatus which transfers a circuit pattern from a mother reticle onto a glass substrate, a silicon wafer, or the like, in order to manufacture a reticle or a mask to be used in photo exposure apparatus, EUV exposure apparatus, X-ray exposure apparatus, electron beam exposure apparatus, and so on, as well as the micro devices such as the semiconductor devices. The exposure apparatus 11 may also be an exposure apparatus used in manufacture of displays including liquid-crystal display devices (LCDs) and others, to transfer a device pattern onto a glass plate, an exposure apparatus used in manufacture of thin-film magnetic heads or the like to transfer a device pattern onto a ceramic wafer or the like, or an exposure apparatus used in manufacture of imaging devices such as CCDs.

The illumination optical apparatus 13 in each of the embodiments can be mounted on a scanning stepper configured to transfer a pattern of an illumination target object onto a substrate in a state in which the illumination target object and the substrate are relatively moved, and to successively move the substrate stepwise, and can also be mounted on a stepper of the step-and-repeat method configured to transfer a pattern of an illumination target object onto a substrate in a state in which the illumination target object and the substrate are stationary, and to successively move the substrate stepwise.

In each embodiment, the exposure light source 12 may be, for example, an exposure light source capable of supplying the g-line (436 nm), the i-line (365 nm), the KrF excimer laser (248 nm), the $F_2$ laser (157 nm), the $Kr_2$ laser (146 nm), the $Ar_2$ laser (126 nm), or the like. The exposure light source 12 may also be an exposure light source capable of supplying a harmonic obtained by amplifying a single-wavelength laser beam in the infrared region or in the visible region lased from a DFB semiconductor laser or a fiber laser, for example, by a fiber amplifier doped with erbium (or with both of erbium and ytterbium), and converting the wavelength into ultraviolet light with a nonlinear optical crystal.

In each embodiment, it is also possible to apply the so-called polarized illumination method disclosed in U.S. Pat. Published Application Nos. 2006/0203214, 2006/0170901, and 2007/0146676. Teachings of the U.S. Pat. Published Application Nos. 2006/0203214, 2006/0170901, and 2007/0146676 are incorporated herein by reference.

Figure 9:
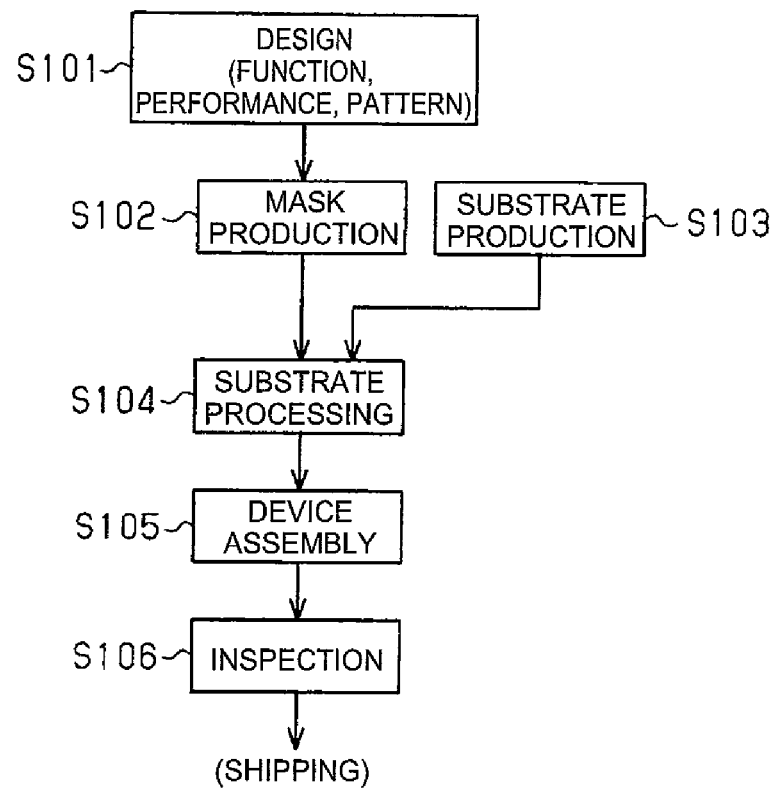
FIG. 9 is a flowchart of a manufacture example of devices.

The below will describe an embodiment of a manufacture method of micro devices using the device manufacturing method with the exposure apparatus 11 of the embodiments of the present invention in the lithography process. FIG. 9 is a drawing showing a flowchart of a manufacture example of micro devices (semiconductor chips such as ICs and LSIs, liquid crystal panels, CCDs, thin-film magnetic heads, micromachines, etc.).

The first block S101 (design block) is to design the function and performance of micro devices (e.g., design the circuitry for semiconductor devices or the like) and to design a pattern for realizing the function. The subsequent block S102 (mask production block) is to produce a mask (reticle R or the like) on which the designed circuit pattern is formed. On the other hand, block S103 (substrate production block) is to produce a substrate of a material such as silicon, glass, or ceramics (which becomes a wafer W where a silicon material is used). The next block S104 (substrate processing block) is to form an actual circuit and others on the substrate by the lithography technology and others, as described below, using the mask and the substrate prepared in the blocks S101-S103. The next block S105 (device assembly block) is to assemble devices using the substrate processed in block S104. This block S105 includes such blocks as a dicing block, a bonding block, and a packaging block (chip encapsulation) as occasion may demand. The final block 8106 (inspection block) is to perform such inspections as an operation check test and a durability test of the micro devices fabricated in block S105. After completion of these blocks, the micro devices are completed and shipped.

FIG. 10 is a drawing showing an example of detailed blocks in the block 8104 in the case of semiconductor devices.

Block S111 (oxidation block) is to oxidize the surface of the substrate. Block S112 (CVD block) is to form an insulating film on the surface of the substrate. Block S113 (electrode forming block) is to form electrodes on the substrate by evaporation. Block S114 (ion implantation block) is to implant ions into the substrate. Each of the above blocks S111-S114 constitutes a preprocessing block in each stage of substrate processing and is executed as selected according to a process necessary in each stage.

After completion of the above-described preprocessing blocks in the stages of the substrate processing, post-processing blocks are executed as described below. In the post-processing blocks, the first block S115 (resist forming block) is to apply a photosensitive material onto the substrate. The subsequent block S116 (exposure block) is to transfer the circuit pattern of the mask onto the wafer by the above-described lithography system (exposure apparatus 11). The next block S117 (development block) is to develop the substrate exposed in block S116, to form a mask layer consisting of the circuit pattern on the surface of the substrate. In block S118 (etching block) subsequent thereto, the exposed member is removed by etching from the portions other than the resist-remaining portions. The following block S119 (resist removal block) is to remove the photosensitive material unnecessary after the etching. Namely, the blocks S118 and S119 are to process the surface of the substrate through the mask layer. By repeatedly carrying out these preprocessing blocks and post-processing blocks, circuit patterns are multiply formed on the substrate.

Namely, as mentioned above, according to embodiments of the present invention, the light emitted from the light source is guided to the illumination target object by the plurality of spatial light modulation members arranged in the array form. For this reason, the timing of replacement of the spatial light modulation member with temporary suspension of drive of the exposure apparatus can be delayed by increase in the number of spatial light modulation members used, when compared with the conventional case where the light emitted from the light source is guided to the illumination target object with the use of one spatial light modulation member. Therefore, a contribution can be made to increase in manufacture efficiency of devices with increase in output of the light source, even in the case where the spatial light modulation member is arranged in the optical path of the light emitted from the light source.

Embodiments of the present invention successfully achieve the contribution to increase in manufacture efficiency of devices with increase in output of the light source.

In the above-described embodiments, the light source 12 can be, for example, an ArF excimer laser light source which supplies pulsed laser light at the wavelength of 193 nm, or a KrF excimer laser light source which supplies pulsed laser light at the wavelength of 248 nm. Without having to be limited to these, it is also possible, for example, to use another appropriate light source such as an $F_2$ laser light source or an ultrahigh pressure mercury lamp. The exposure apparatus of the above-described embodiments can be used as scanning exposure apparatus performing exposure while moving the reticle (mask) and the wafer (photosensitive substrate) relative to the projection optical system, or as exposure apparatus of the one-shot exposure type performing projection exposure in a state in which the reticle (mask) and the wafer (photosensitive substrate) are stationary relative to the projection optical system.

In the foregoing embodiment, it is also possible to apply a technique of filling the interior of the optical path between the projection optical system and the photosensitive substrate with a medium having the refractive index larger than 1.1 (typically, a liquid), which is so called a liquid immersion method. In this case, it is possible to adopt one of the following techniques as a technique of filling the interior of the optical path between the projection optical system and the photosensitive substrate with the liquid: the technique of locally filling the optical path with the liquid as disclosed in International Publication WO99/49504; the technique of moving a stage holding the substrate to be exposed, in a liquid bath as disclosed in Japanese Patent Application Laid-open No. 6-124873; the technique of forming a liquid bath of a predetermined depth on a stage and holding the substrate therein as disclosed in Japanese Patent Application Laid-open No. 10-303114, and so on. The teachings in WO99/49504, Japanese Patent Application Laid-open No. 6-124873, and Japanese Patent Application Laid-open No. 10-303114 are incorporated herein by reference.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An illumination optical system which illuminates a plane to be illuminated with illumination light from a light source, the illumination optical system comprising, in order from the light source side:
   an optical element having a plurality of optical surfaces for splitting the illumination light into a plurality of beams;
   a first optical system which condenses the plurality of the beams and guides the condensed plurality of the beams to a predetermined plane, the first optical system refocusing the plurality of beams split by the optical element such that first paths of the plurality of beams prior to entering the first optical system are different from second paths of the plurality of beams after exiting the first optical system;
   a spatial optical modulator arranged on the predetermined plane and having a plurality of reflecting optical elements each of which has a movable reflection surface arranged to receive a respective beam of the plurality of beams traversing the second paths; and
   a second optical system arranged to distribute a plurality of light beams from the movable reflection surface of each of the reflecting optical elements at a pupil position of the illumination optical system or a position optically conjugate with the pupil position and to form a spatial light distribution at the pupil position or the position optically conjugate with the pupil position.

2. The illumination optical system according to claim 1, wherein
   the second optical system has an optical plane array having a plurality of optical surfaces two-dimensionally arranged.

3. The illumination optical system according to claim 2, wherein
   the plurality of the optical surfaces of the optical plane array is arranged along a plane crossing an optical path adjacent to the pupil position or adjacent to the position optically conjugate with the pupil position.

4. The illumination optical apparatus according to claim 2, wherein
   the second optical system comprises a condenser optical system arranged between the spatial optical modulator and the optical plane array.

5. The illumination optical apparatus according to claim 4, wherein
   the condenser optical system converts angle information of an incident light into a position information thereof.

6. The illumination optical system according to claim 4, wherein
   a back focal position of the condenser optical system is positioned near a plane on which the optical plane array is arranged.

7. The illumination optical system according to claim 2, wherein
   the optical plane array has a plurality of lens surfaces two-dimensionally arranged.

8. The illumination optical system according to claim 1, further comprising
   a third optical system arranged between the second optical system and the plane to be illuminated, which performs Köhler illumination to the plane to be illuminated with light distributed at the pupil position or at the position optically conjugate with the pupil position by the second optical system.

9. The illumination optical system according to claim 1, wherein
   the illumination optical system is used with a projection optical system which forms a pattern image arranged in the plane to be illuminated on a substrate, and the pupil position is optically conjugate with a pupil plane of the projection optical system.

10. The illumination optical system according to claim 1, wherein
    the optical element has a plurality of lens surfaces arranged in a plane crossing an optical path of the illumination light.

11. The illumination optical system according to claim 1, wherein
    an optical axis of the second optical system intersects with the predetermined plane at a non-perpendicular angle.

12. The illumination optical system according to claim 1, wherein
    a plane containing the plurality of optical surfaces of the optical element is parallel with the predetermined plane.

13. The illumination optical system according to claim 1, wherein
    the first optical system includes a relay optical system.

14. An illumination method of illuminating a plane to be illuminated with illumination light from a light source, the method comprising:
    splitting the illumination light into a plurality of beams by using an optical element having a plurality of optical surfaces;
    condensing the plurality of the beams from the plurality of the optical surfaces by using a first optical system, the first optical system refocusing the plurality of beams split by the optical element such that first paths of the plurality of beams prior to entering the first optical system are different from second paths of the plurality of beams after exiting the first optical system, and the first optical system further guiding the plurality of beams to a predetermined plane;
    giving an angle distribution of the light from a spatial light modulator arranged on the predetermined plane by using the spatial light modulator having a plurality of reflecting optical elements each of which has a movable reflection surface arranged to receive a respective beam of the plurality of beams traversing the second paths;
    distributing a plurality of light beams from the movable reflection surface of each of the reflecting optical elements at a pupil position of an illumination optical system or a position optically conjugate with the pupil position; and
    forming a spatial light distribution at the pupil position or the position optically conjugate with the pupil position on the basis of the plurality of light beams.

15. A device manufacturing method comprising:
    illuminating a pattern with illumination light from a light source by using the illumination method according to claim 14;
    exposing a photosensitive substrate with light from the pattern;
    after developing the photosensitive substrate on which the pattern is transferred, forming a mask layer having a shape corresponding to the pattern on a surface of the photosensitive substrate; and
    processing the surface of the photosensitive substrate through the mask layer.

* * * * *

UNITED STATES PATENT AND TRADEMARK OFFICE
CERTIFICATE OF CORRECTION

Page 1 of 1

| | |
|---|---|
| PATENT NO. | : 9,097,981 B2 |
| APPLICATION NO. | : 12/250519 |
| DATED | : August 4, 2015 |
| INVENTOR(S) | : Hiroyuki Hirota |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 947 days.

Signed and Sealed this
Nineteenth Day of April, 2016

Michelle K. Lee
*Director of the United States Patent and Trademark Office*